United States Patent
Sung et al.

(10) Patent No.: US 12,336,378 B2
(45) Date of Patent: *Jun. 17, 2025

(54) ORGANIC LIGHT EMITTING DISPLAY DEVICE AND METHOD OF MANUFACTURING THE SAME

(71) Applicant: SAMSUNG DISPLAY CO., LTD., Yongin-si (KR)

(72) Inventors: Wooyong Sung, Yongin-si (KR); Seungho Yoon, Yongin-si (KR); Wonje Cho, Yongin-si (KR); Wonwoo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

This patent is subject to a terminal disclaimer.

(21) Appl. No.: 17/666,509

(22) Filed: Feb. 7, 2022

(65) Prior Publication Data

US 2022/0158131 A1     May 19, 2022

Related U.S. Application Data

(63) Continuation of application No. 15/924,658, filed on Mar. 19, 2018, now Pat. No. 11,245,093.

(30) Foreign Application Priority Data

Sep. 11, 2017    (KR) .......................... 10-2017-0116131

(51) Int. Cl.
    *H01L 51/52*       (2006.01)
    *H01L 27/32*       (2006.01)
              (Continued)

(52) U.S. Cl.
    CPC ........... *H10K 50/844* (2023.02); *H10K 50/80* (2023.02); *H10K 77/111* (2023.02);
              (Continued)

(58) Field of Classification Search
    CPC ............. H01L 51/5253; H01L 51/0097; H01L 27/3248; H01L 27/3262; H01L 27/124;
              (Continued)

(56) References Cited

U.S. PATENT DOCUMENTS

6,037,712 A *   3/2000   Codama ................. H10K 59/10
                                                                   428/917
8,389,983 B2     3/2013   Seo et al.
                        (Continued)

FOREIGN PATENT DOCUMENTS

CN        104103775 A1    10/2014
EP          2806473 A1    11/2014
              (Continued)

OTHER PUBLICATIONS

European search report dated Jan. 2, 2019 from the European Patent Office for European Patent Application No. 18177779.8.

(Continued)

*Primary Examiner* — Mary A Wilczewski
*Assistant Examiner* — Tsz K Chiu
(74) *Attorney, Agent, or Firm* — Womble Bond Dickinson (US) LLP

(57) ABSTRACT

An organic light emitting display device may include a flexible substrate, a common layer, and an encapsulation member. An undercut groove may be formed on the flexible substrate. The common layer may be disposed on the flexible substrate, may include an organic light emitting layer, and may be disconnected by the groove. The encapsulation member may be disposed on the common layer, and may cover the common layer.

20 Claims, 24 Drawing Sheets

(51) Int. Cl.
- H01L 51/56 (2006.01)
- H10K 50/80 (2023.01)
- H10K 50/844 (2023.01)
- H10K 77/10 (2023.01)
- *H10D 86/40* (2025.01)
- *H10D 86/60* (2025.01)
- *H10K 59/12* (2023.01)
- *H10K 59/122* (2023.01)
- *H10K 59/124* (2023.01)
- *H10K 102/00* (2023.01)

(52) U.S. Cl.
CPC ......... *H10D 86/441* (2025.01); *H10D 86/451* (2025.01); *H10D 86/60* (2025.01); *H10K 59/12* (2023.02); *H10K 59/1201* (2023.02); *H10K 59/122* (2023.02); *H10K 59/124* (2023.02); *H10K 2102/311* (2023.02)

(58) Field of Classification Search
CPC .. H01L 27/1248; H10K 50/844; H10K 50/80; H10K 77/111; H10K 59/12; H10K 59/1201; H10K 59/122; H10K 59/124; H10K 2102/311; H10K 59/00; H10K 59/123; H10K 50/84; H10K 71/00
See application file for complete search history.

(56) References Cited

U.S. PATENT DOCUMENTS

| | | | |
|---|---|---|---|
| 8,669,579 B2 | 3/2014 | Ikeda et al. | |
| 8,928,011 B2* | 1/2015 | Tanada | H10K 50/824 313/503 |
| 9,136,311 B2 | 9/2015 | Kim et al. | |
| 9,406,905 B2 | 8/2016 | Park et al. | |
| 9,548,472 B2 | 1/2017 | Yang et al. | |
| 9,553,280 B2 | 1/2017 | Seo et al. | |
| 9,632,487 B2 | 4/2017 | Kim et al. | |
| 9,673,014 B2 | 6/2017 | Kim et al. | |
| 9,773,823 B2 | 9/2017 | Kang et al. | |
| 9,793,334 B2 | 10/2017 | Park et al. | |
| 9,853,250 B2 | 12/2017 | Hong et al. | |
| 10,032,835 B2 | 7/2018 | Min et al. | |
| 10,541,380 B1* | 1/2020 | Sung | H01L 21/76205 |
| 10,580,840 B2* | 3/2020 | Kim | H10K 59/122 |
| 10,615,369 B2 | 4/2020 | Choi et al. | |
| 10,897,026 B2 | 1/2021 | Abe | |
| 11,056,674 B2* | 7/2021 | Choung | H10K 50/82 |
| 11,398,523 B2* | 7/2022 | Qin | H01L 27/1255 |
| 11,610,947 B2* | 3/2023 | Xie | H10K 71/231 |
| 2001/0014438 A1 | 8/2001 | Tai et al. | |
| 2003/0189206 A1* | 10/2003 | Koyama | G09G 3/3241 257/59 |
| 2005/0032266 A1 | 2/2005 | Suzuki | |
| 2008/0116544 A1 | 5/2008 | Grinman et al. | |
| 2009/0212303 A1 | 8/2009 | Toerker et al. | |
| 2014/0339517 A1 | 11/2014 | Park et al. | |
| 2014/0374759 A1 | 12/2014 | Kim et al. | |
| 2015/0162564 A1* | 6/2015 | Kodama | H10K 59/00 257/40 |
| 2015/0227172 A1* | 8/2015 | Namkung | H10K 59/40 345/173 |
| 2015/0277643 A1* | 10/2015 | Kim | G06F 1/1626 345/173 |
| 2016/0043341 A1* | 2/2016 | Heo | H10K 59/122 438/23 |
| 2016/0149155 A1* | 5/2016 | Kim | H10K 59/122 438/23 |
| 2016/0190389 A1* | 6/2016 | Lee | A61B 5/0075 438/28 |
| 2016/0351645 A1 | 12/2016 | You et al. | |
| 2016/0363909 A1 | 12/2016 | Kang et al. | |
| 2017/0148856 A1* | 5/2017 | Choi | H10K 50/844 |
| 2017/0149014 A1 | 5/2017 | Choi et al. | |
| 2017/0373129 A1 | 12/2017 | Kim et al. | |
| 2018/0061907 A1* | 3/2018 | Kim | H10K 59/38 |
| 2018/0151822 A1 | 5/2018 | Kim et al. | |
| 2018/0151831 A1* | 5/2018 | Lee | H10K 50/844 |
| 2018/0351126 A1 | 12/2018 | Choi | |
| 2019/0245015 A1* | 8/2019 | Lee | H10K 71/00 |
| 2019/0288047 A1* | 9/2019 | Jeong | H10K 50/844 |
| 2020/0106045 A1* | 4/2020 | Han | H10K 50/844 |

FOREIGN PATENT DOCUMENTS

| | | |
|---|---|---|
| JP | 2006-004917 A | 1/2006 |
| JP | 2011-124228 A | 6/2011 |
| JP | 2013-134813 A | 7/2013 |
| JP | 2014-021498 A | 2/2014 |
| JP | 2015-023023 A | 2/2015 |
| KR | 10-2009-0068505 A | 6/2009 |
| KR | 10-2014-0137950 A | 12/2014 |
| KR | 10-2016-0059064 A | 5/2016 |
| KR | 10-2016-0125584 A | 11/2016 |
| KR | 10-2017-0021429 A | 2/2017 |
| KR | 10-2017-0059527 A | 5/2017 |
| WO | 2019-030858 A1 | 2/2019 |

OTHER PUBLICATIONS

Digital Technology and Applications, Gong Xiaobin et al., a new type of high pressure Live display device in power distribution equipment, p. 117, China Academic Journal Electronic Publishing House. DOI:10. 19695/j.cnki.cn12-1369.2016. 10.080, including English Abstract (7 pages).

* cited by examiner

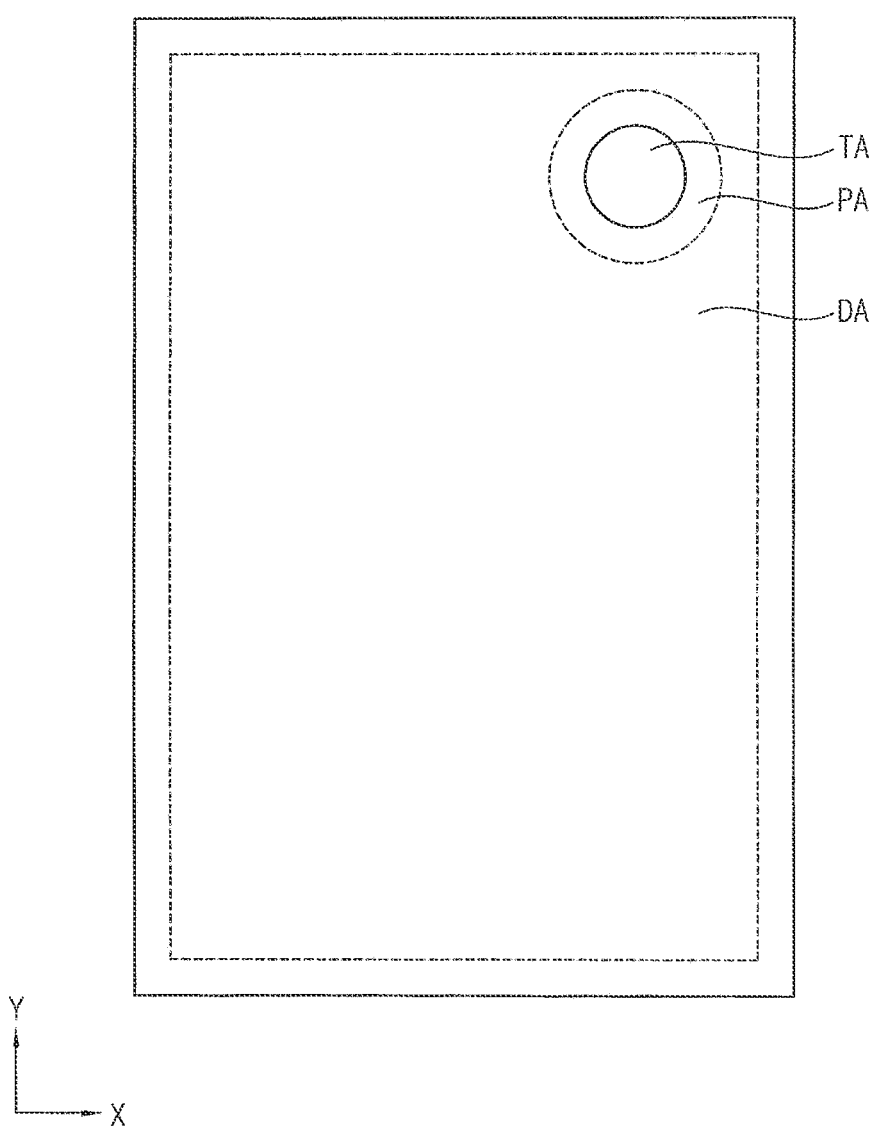

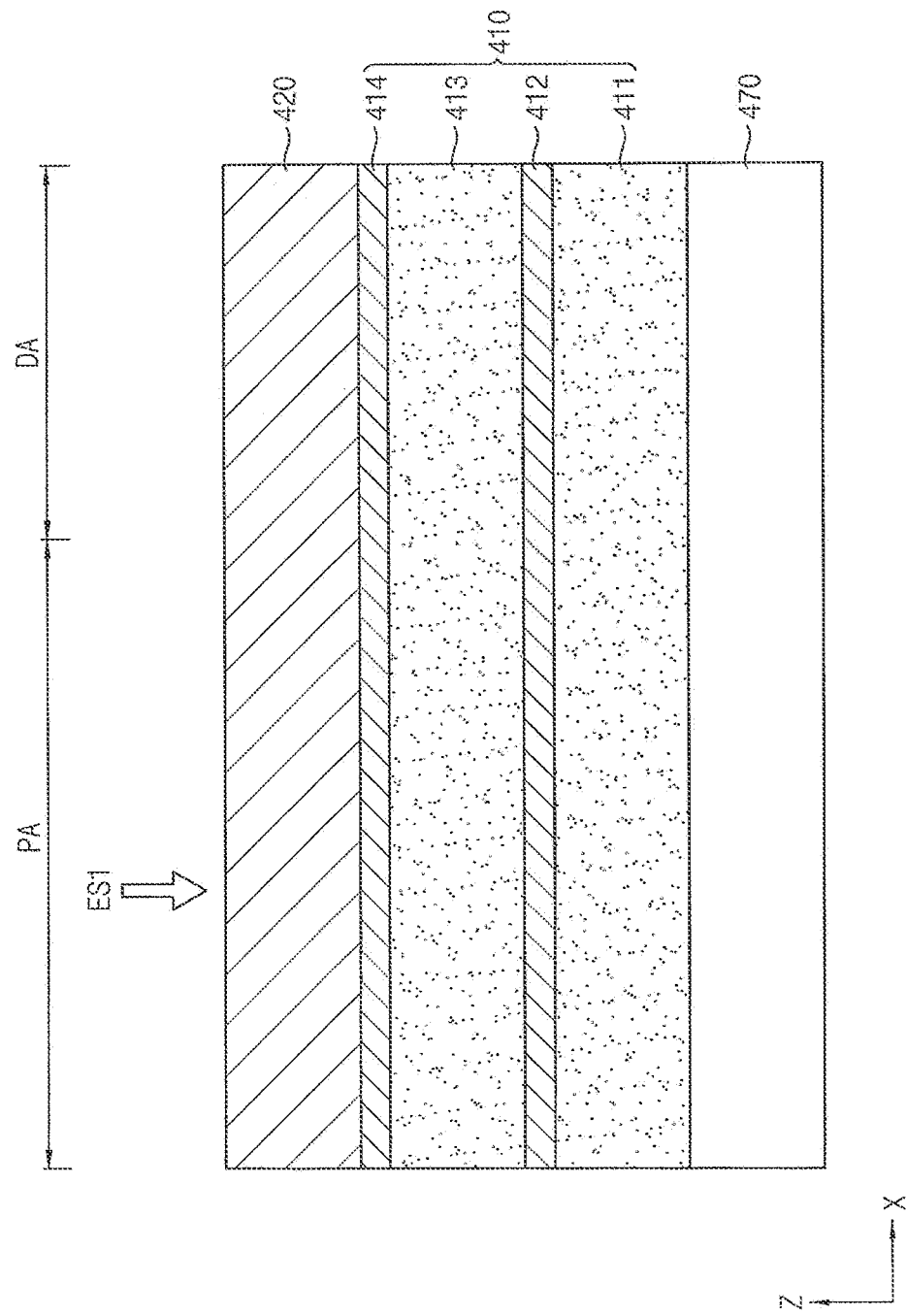

ORGANIC LIGHT EMITTING DISPLAY DEVICE AND METHOD OF MANUFACTURING THE SAME

CROSS-REFERENCE TO RELATED APPLICATIONS

This application is a continuation of U.S. patent application Ser. No. 15/924,658, filed Mar. 19, 2018, which claims priority to and the benefit of Korean Patent Application No. 10-2017-0116131, filed Sep. 11, 2017, the entire content of both of which is incorporated herein by reference.

BACKGROUND

1. Field

Embodiments relate to an organic light emitting display device and a method of manufacturing the organic light emitting display device.

2. Description of the Related Art

A display device is a device for displaying images, and recently, an organic light emitting display device has been receiving attention. The organic light emitting display device is a self-luminous display device. Unlike a liquid crystal display device, the organic light emitting display device may not require a separate light source, and thus, thickness and weight can be reduced. Further, the organic light emitting display device may exhibit high quality characteristics such as low power consumption, high luminance, fast response speeds, and the like.

SUMMARY

Embodiments are directed to an organic light emitting display device including a flexible substrate having a groove, the groove being undercut, a common layer on the flexible substrate, the common layer including an organic light emitting layer and being disconnected by the groove, and an encapsulation member on the common layer, the encapsulation member covering the common layer.

In an embodiment, the flexible substrate may include a first plastic layer and a first barrier layer on the first plastic layer. The first plastic layer may be undercut at the groove with respect to the first barrier layer.

In an embodiment, a laser absorption rate of the first plastic layer may be greater than a laser absorption rate of the first barrier layer.

In an embodiment, the groove may be formed to correspond to an entirety of a thickness of the first barrier layer and a portion of a thickness of the first plastic layer.

In an embodiment, the flexible substrate may include a second plastic layer on the first barrier layer and a second barrier layer on the second plastic layer. The second plastic layer may be undercut at the groove with respect to the second barrier layer.

In an embodiment, a laser absorption rate of the second plastic layer may be greater than a laser absorption rate of the second barrier layer.

In an embodiment, a width of the groove at the second barrier layer may be greater than a width of the groove at the first barrier layer.

In an embodiment, each of the first plastic layer and the second plastic layer may include at least one of polyimide (PI), polyethylene naphthalate (PEN), polyethylene terephthalate (PET), polyarylate, polycarbonate (PC), polyetherimide (PEI), and polyether sulfone (PES).

In an embodiment, each of the first barrier layer and the second barrier layer may include at least one of silicon oxide, silicon nitride, and amorphous silicon.

In an embodiment, the common layer may include a first portion disposed outside the groove and a second portion disposed inside the groove. The first portion and the second portion may be disconnected from each other.

In an embodiment, the encapsulation member may cover the first portion of the common layer, the second portion of the common layer, and a surface of the flexible substrate that is exposed by the groove.

In an embodiment, the encapsulation member may include at least one inorganic layer and at least one organic layer.

In an embodiment, the at least one inorganic layer may cover a surface of the flexible substrate that is exposed by the groove.

In an embodiment, the at least one organic layer may be disposed outside the groove.

In an embodiment, the encapsulation member may include a first inorganic layer on the common layer, a second inorganic layer on the first inorganic layer, and an organic layer between the first inorganic layer and the second inorganic layer.

Embodiments are also directed to an organic light emitting display device including a flexible substrate including a display area, a through area, and a peripheral area, and having a groove in the peripheral area, the groove being undercut, an organic light emitting element on the display area of the flexible substrate, a common layer on the peripheral area of the flexible substrate, the common layer being disconnected by the groove, and an encapsulation member on the organic light emitting element and the common layer.

In an embodiment, the peripheral area may be disposed between the display area and the through area.

In an embodiment, the peripheral area may surround the through area, and the display area may surround the peripheral area.

In an embodiment, the organic light emitting element may include a pixel electrode, a first organic function layer on the pixel electrode, an organic light emitting layer on the first organic function layer, a second organic function layer on the organic light emitting layer, and a common electrode on the second organic function layer.

In an embodiment, the common layer may be an extended portion of at least one of the first organic function layer, the second organic function layer, and the common layer.

In an embodiment, the organic light emitting display device may further include a capping layer between the organic light emitting element and the encapsulation member. The common layer may be an extended portion of at least one of the first organic function layer, the second organic function layer, the common layer, and the capping layer.

Embodiments are also directed to a method of manufacturing an organic light emitting display device, including forming a flexible substrate on a carrier substrate, forming a groove on the flexible substrate, the groove being undercut, forming a common layer on the flexible substrate, the common layer including an organic light emitting layer and being disconnected by the groove, and forming an encapsulation member on the common layer, the encapsulation member covering the common layer.

In an embodiment, forming the flexible substrate may include forming a first plastic layer on the carrier substrate and forming a first barrier layer on the first plastic layer.

In an embodiment, the groove may be integrally formed in the first plastic layer and the first barrier layer.

In an embodiment, the groove may be formed by irradiating a laser to the flexible substrate.

In an embodiment, a laser absorption rate of the first plastic layer may be greater than a laser absorption rate of the first barrier layer.

In an embodiment, forming the flexible substrate may further include forming a second plastic layer on the first barrier and forming a second barrier layer on the second plastic layer. The groove may be integrally formed in the first plastic layer, the first barrier layer, the second plastic layer, and the second barrier layer.

In an embodiment, the groove may be formed by irradiating a laser to the flexible substrate.

In an embodiment, a laser absorption rate of the second plastic layer may be greater than a laser absorption rate of the second barrier layer.

In an embodiment, the method may further include separating the carrier substrate from the flexible substrate, attaching a lower protective film on a surface of the flexible substrate from which the carrier substrate is separated, and forming a polarizing member on the encapsulation member.

In an embodiment, the method may further include attaching an upper protective film on the encapsulation member before separating the carrier substrate and removing the upper protective film before forming the polarizing member.

In an embodiment, the method may further include forming a through hole passing through the lower protective film, the flexible substrate, the common layer, the encapsulation member, and the polarizing member.

In an embodiment, at least a portion of the groove may be exposed by the through hole.

BRIEF DESCRIPTION OF THE DRAWINGS

Features will become apparent to those of skill in the art by describing in detail example embodiments with reference to the attached drawings in which:

FIGS. 1A and 1B illustrate plan views of an organic light emitting display device according to an example embodiment.

FIGS. 10A, 10B, 10C, 10D, 10E, 10F, 10G, and 10H illustrate cross-sectional views of stages in a method of manufacturing an organic light emitting display device according to an example embodiment.

DETAILED DESCRIPTION

Figure 1A:
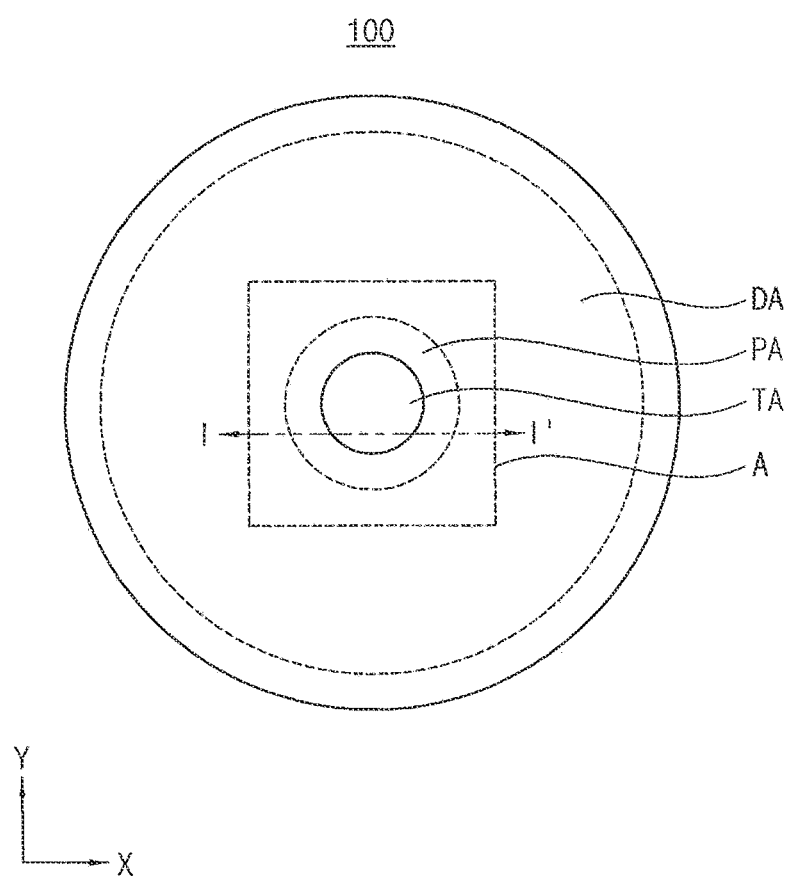

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

Hereinafter, a planar structure of an organic light emitting display device according to an example embodiment will be explained with reference to FIGS. 1A and 1B.

FIGS. 1A and 1B are plan views illustrating an organic light emitting display device according to an example embodiment.

Referring to FIGS. 1A and 1B, an organic light emitting display device 100 according to an example embodiment may include a display area DA, a through area TA, and a peripheral area PA. An image may be displayed from the display area DA. A plurality of pixels each emitting light may be disposed in the display area DA to display an image.

The through area TA may be an area for disposing, for example, a camera, a sensor, a speaker, or the like, which is included in the organic light emitting display device 100. The through area TA may be provided by, for example forming a through hole corresponding to the through area TA after forming insulation layers, conductive layers, organic layers, or the like on a substrate. The formation of the through hole will be explained in detail below.

FIGS. 1A and 1B illustrate the through area TA having a substantially circular shape, however, the present embodiment is not limited thereto. The through area TA may have a shape such as, for example, a polygonal shape including a square, a triangle, etc.

The peripheral area PA may be located between the display area DA and the through area TA. The peripheral area PA may surround the through area TA. In an implementation, the display area DA may surround the peripheral area PA. A driving circuit for supplying driving signals, e.g., a data signal and a gate signal, to the pixels may be disposed in the peripheral area PA.

Hereinafter, a through hole and a groove formed in the organic light emitting display device according to an example embodiment will be explained with reference to FIGS. 2 and 3.

Figure 2:
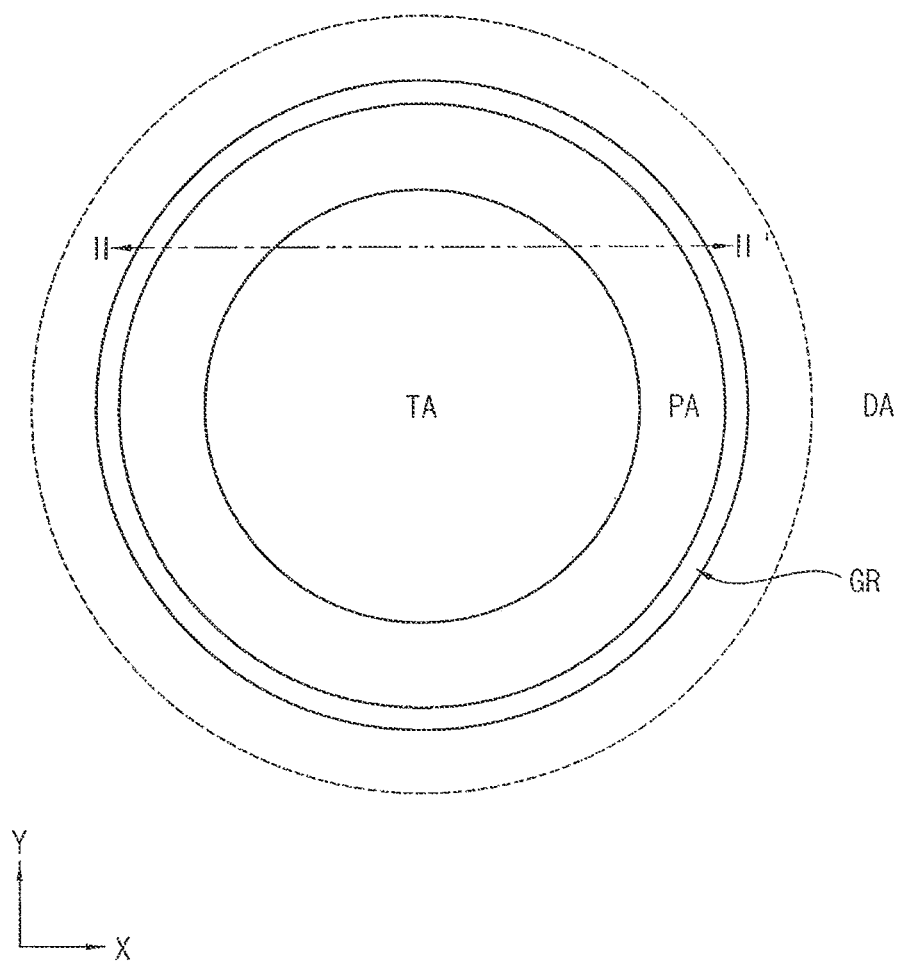
FIG. 2 illustrates a plan view illustrating a region A in FIG. 1A.

FIG. 2 is a plan view illustrating a region A in FIG. 1A. FIG. 3 is a cross-sectional view cut along a line I-I' in FIG. 1A.

Figure 3:
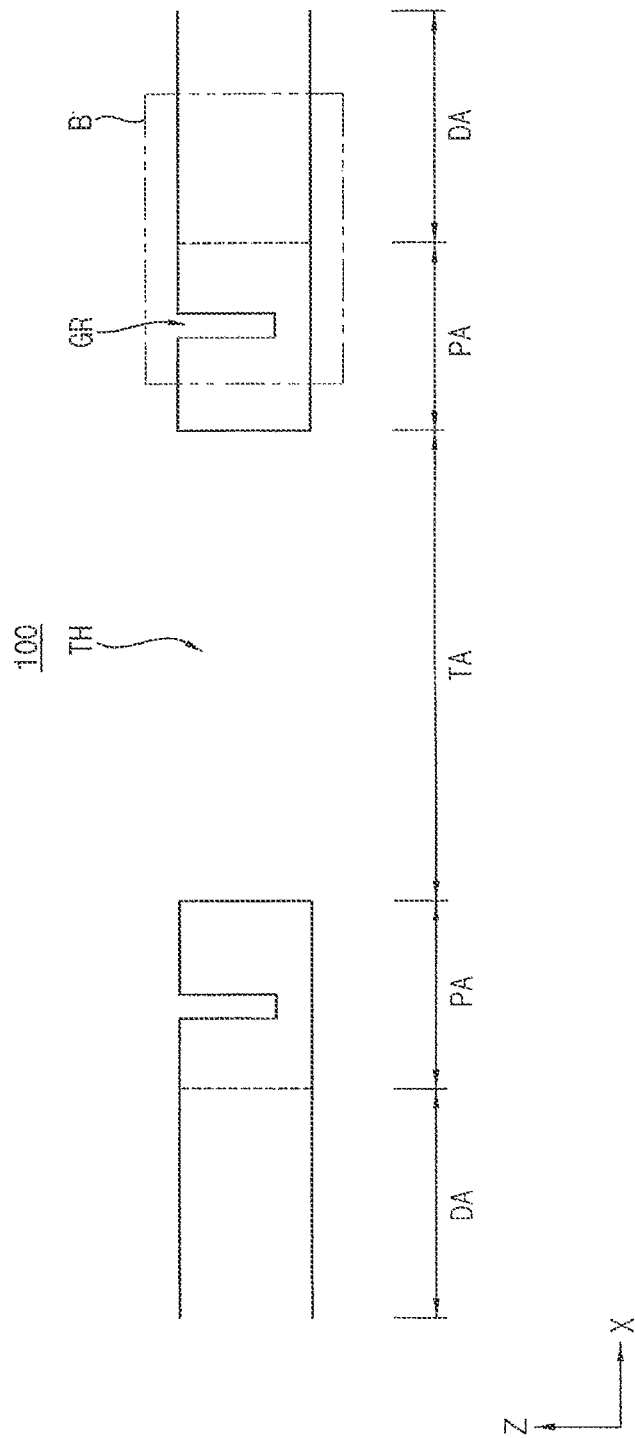
FIG. 3 illustrates a cross-sectional view cut along a line I-I' in FIG. 1A.

Referring to FIGS. 2 and 3, a through hole TH and a groove GR may be formed in the organic light emitting display device 100 according to an embodiment. The through area TA may be defined by the through hole TH. The groove GR may be formed in the peripheral area PA.

The groove GR may be located between the display area DA and the through area TA. The groove GR may have a shape surrounding the through hole TH. A depth of the through hole TH may correspond to an entirety of a thickness of the organic light emitting display device 100. A depth of the groove GR may correspond to a portion of the thickness of the organic light emitting display device 100.

FIGS. 2 and 3 illustrate that one groove GR is disposed in the peripheral area PA, however, the present embodiment is not limited thereto. In an implementation, a plurality of grooves GR surrounding the through hole TH may be formed in the peripheral area PA.

Hereinafter, a cross-sectional structure of the organic light emitting display device will be explained in detail with reference to FIG. 4.

Figure 4:
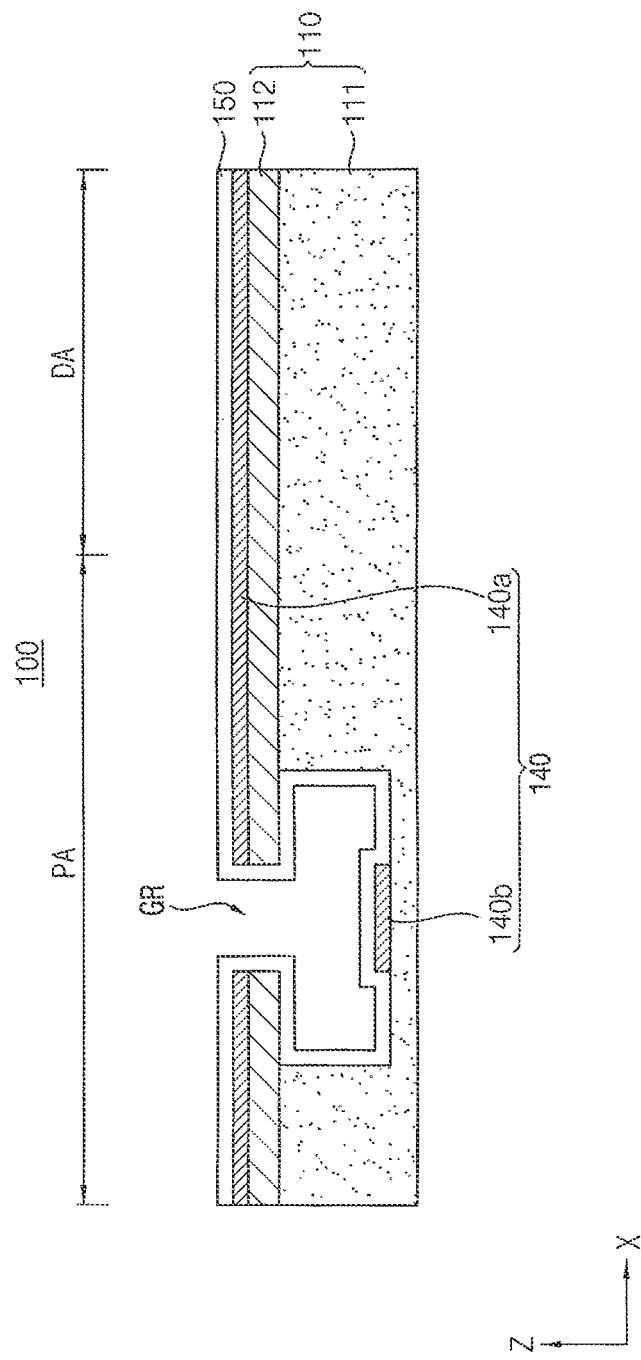
FIG. 4 illustrates a cross-sectional view of a region B in FIG. 3.

FIG. 4 is a cross-sectional view illustrating a region B in FIG. 3.

Referring to FIG. 4, an organic light emitting display device 100 according to an embodiment may include a flexible substrate 110, a common layer 140, and an encapsulation member 150.

The flexible substrate 110 may include a first plastic layer 111 and a first barrier layer 112. The first plastic layer 111 may be formed of, for example, a plastic material having high heat resistance and high durability such as polyimide (PI), polyethylene naphthalate (PEN), polyethylene terephthalate (PET), polyarylate, polycarbonate (PC), polyetherimide (PEI) or polyether sulfone (PES).

Moisture or oxygen may more easily penetrate through the first plastic layer 111 formed of the plastic material than a glass substrate. Thus, an organic light emitting layer that is vulnerable to moisture or oxygen may be degraded when moisture or oxygen permeates through the first plastic layer 111, which may reduce the lifespan of an organic light emitting element. In order to prevent the penetration of oxygen and moisture, the first barrier layer 112 may be formed on the first plastic layer 111.

The first barrier layer 112 may be formed of, for example, an inorganic material such as silicon oxide, silicon nitride, or amorphous silicon. A water vapor transmission rate (WVTR) of the first barrier layer 112 may be less than or equal to about 10-5 g/m$^2$ day.

The groove GR may be formed in the flexible substrate 110. The groove GR may be formed in the peripheral area PA. The groove GR may correspond to a portion of a thickness of the flexible substrate 100. For example, the groove GR may correspond to an entirety of a thickness of the first barrier layer 112 and a portion of a thickness of the first plastic layer 111.

The groove GR may have an undercut shape. For example, as shown in FIG. 4, the first plastic layer 111 may be undercut with respect to the first barrier layer 112 at the groove GR. Thus, the first barrier layer 112 may protrude laterally with respect to the first plastic layer 111 at the groove GR. Thus, a width of the groove GR at the first plastic layer 111 may be greater than a width of the groove GR at the first barrier layer 112.

The common layer 140 may be disposed on the flexible substrate 110. The common layer 140 may include an organic light emitting layer.

The common layer 140 may be disconnected by the groove GR. The disconnection of the common layer 140 may help prevent lateral infiltration of impurities along the interface of the common layer 140. The common layer 140 may include a first portion 140a disposed outside the groove GR and a second portion 140b disposed inside the groove GR. For example, the first portion 140a may be disposed on the first barrier layer 112 outside the groove GR. Further, the second portion 140b may be disposed on the first plastic layer 111 inside the groove GR.

The first portion 140a and the second portion 140b of the common layer 140 may be disconnected from each other. The first portion 140a and the second portion 140b of the common layer 140 may be disconnected by an undercut shape and a depth of the groove GR.

The encapsulation member 150 covering the common layer 140 may be disposed thereon. The encapsulation member 150 may be formed of, for example, an inorganic material such as aluminum oxide, silicon oxide, silicon nitride, silicon oxynitride, silicon carbide, titanium oxide, zirconium oxide, zinc oxide, or the like.

The encapsulation member 150 may cover the first portion 140a and the second portion 140b of the common layer 140, and a surface of the flexible substrate 110 that is exposed by the groove GR. For example, the encapsulation member 150 may cover an upper surface and a sidewall of the first portion 140a of the common layer 140 and an upper surface and a sidewall of the second portion 140b of the common layer 140. The encapsulation member 150 may further cover an upper surface and a sidewall of the first plastic layer 111 and a lower surface and a sidewall of the first barrier layer 112 that are exposed by the groove GR.

Hereinafter, a cross-sectional structure of the organic light emitting display device according to an example embodiment will be explained in detail with reference to FIG. 5.

Figure 5:
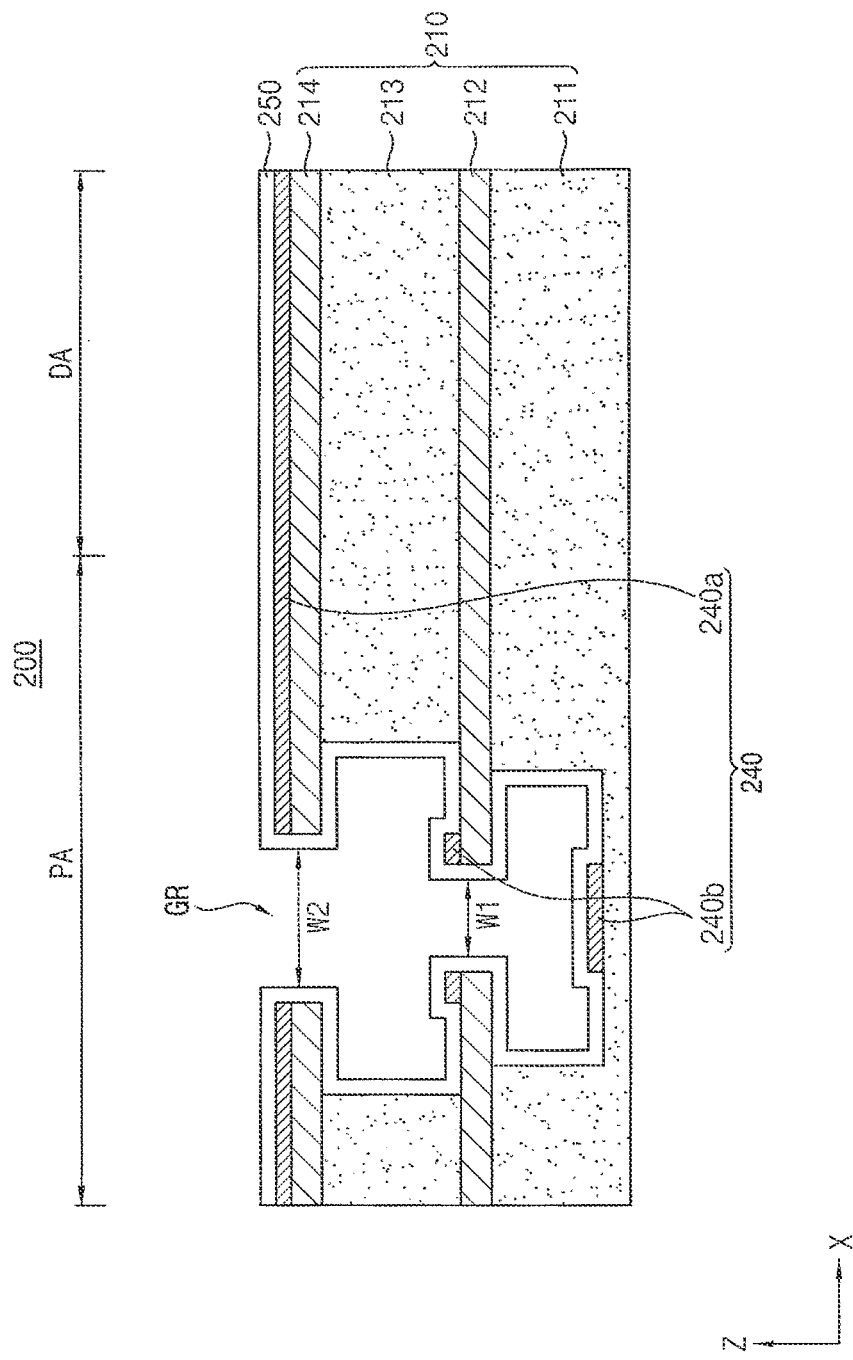
FIG. 5 illustrates a cross-sectional view of an organic light emitting display device according to an example embodiment.

FIG. 5 is a cross-sectional view illustrating an organic light emitting display device according to an example embodiment.

The example embodiment illustrated in FIG. 5 is substantially the same as the example embodiment illustrated in FIG. 4 except for elements of the flexible substrate, so redundant explanations may be omitted.

Referring to FIG. 5, an organic light emitting display device 200 according to an embodiment may include a flexible substrate 210, a common layer 240, and an encapsulation member 250.

The flexible substrate 210 may include a first plastic layer 211, a first barrier layer 212, a second plastic layer 213, and a second barrier layer 214. The second plastic layer 213 may be formed of, for example, a plastic material having high heat resistance and high durability such as polyimide (PI), polyethylene naphthalate (PEN), polyethylene terephthalate (PET), polyarylate, polycarbonate (PC), polyetherimide (PEI) or polyether sulfone (PES).

The second barrier layer 214 may be disposed on the second plastic layer 213. The second barrier layer 214 may be formed of, for example, an inorganic material such as silicon oxide, silicon nitride, or amorphous silicon. A water vapor transmission rate (WVTR) of the second barrier layer 214 may be less than or equal to about 10-5 g/m$^2$ day.

The groove GR may be formed in the flexible substrate 210. The groove GR may correspond to an entirety of a thickness of the second barrier layer 214, an entirety of a thickness of the second plastic layer 213, an entirety of a thickness of the first barrier layer 212, and a portion of a thickness of the first plastic layer 211.

The groove GR may have an undercut shape. For example, the second plastic layer 213 may be undercut with respect to the second barrier layer 214 at the groove GR. Thus, the second barrier layer 214 may protrude laterally with respect to the second plastic layer 213 at the groove GR. Thus, a width of the groove GR at the second plastic layer 213 may be greater than a width of the groove GR at the second barrier layer 214.

A width of the groove GR may decrease from top to bottom of the flexible substrate 210. For example, a width W2 of the groove GR at the second barrier layer 214 may be greater than a width W1 of the groove GR at the first barrier layer 212. Further, a width of the groove GR at the second plastic layer 213 may be greater than a width of the groove GR at the first plastic layer 211.

The common layer 240 may include a first portion 240a disposed outside the groove GR and a second portion 240b disposed inside the groove GR. For example, the first portion 240a may be disposed on the second barrier layer 214 outside the groove GR. Further, a portion of the second portion 240b may be disposed on the first barrier layer 212 inside the groove GR, and another portion of the second portion 240b may be disposed on the first plastic layer 211 inside the groove GR.

The encapsulation member 250 may cover an upper surface and a sidewall of the first portion 240a of the common layer 240 and an upper surface and a sidewall of the second portion 240b of the common layer 240. The encapsulation member 250 may cover an upper surface and a sidewall of the first plastic layer 211, a lower surface, a sidewall, and an upper surface of the first barrier layer 212, a sidewall of the second plastic layer 213, and a lower surface and a sidewall of the second barrier layer 214 which are exposed by the groove GR.

Hereinafter, a cross-sectional structure of an organic light emitting display device according to an example embodiment will be explained in detail with reference to FIG. 6.

Figure 6:
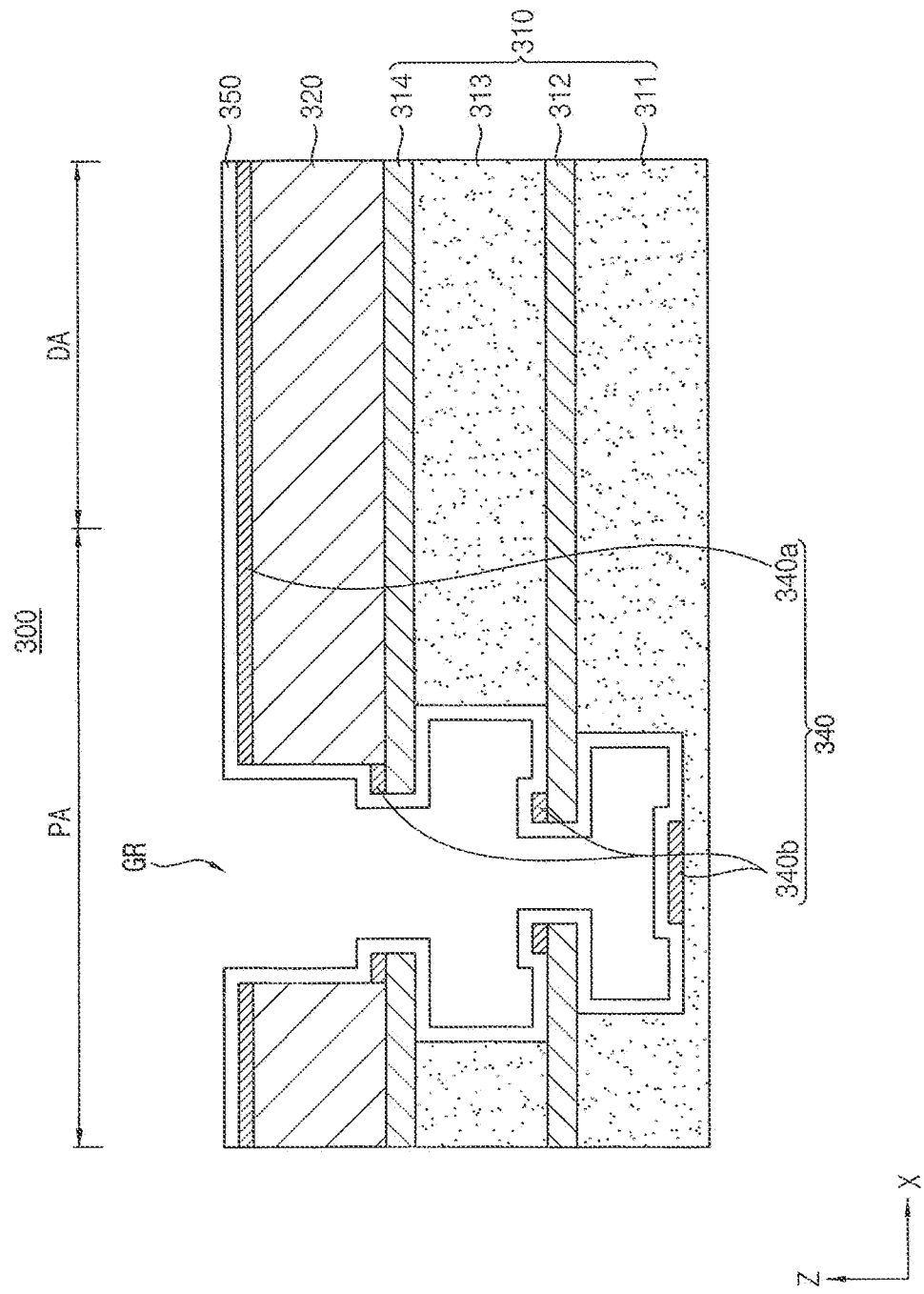
FIG. 6 illustrates a cross-sectional view of an organic light emitting display device according to an example embodiment.

FIG. 6 is a cross-sectional view illustrating an organic light emitting display device according to an example embodiment.

The example embodiment illustrated in FIG. 6 is substantially the same as the embodiment illustrated in FIG. 5 except for further including a lower structure, so redundant explanations may be omitted.

Referring to FIG. 6, an organic light emitting display device 300 according to an example embodiment may include a flexible substrate 310, a lower structure 320, a common layer 340, and an encapsulation member 350.

The lower structure 320 may be disposed between the flexible substrate 310 and the common layer 340. A groove GR may be formed in the lower structure 320 and the flexible substrate 310. The groove GR may correspond to an entirety of a thickness of the lower structure 320, an entirety of a thickness of the second barrier layer 314, an entirety of a thickness of the second plastic layer 313, an entirety of a thickness of the first barrier layer 312, and a portion of a thickness of the first plastic layer 311.

The lower structure 320 may include a plurality of inorganic layers. Detailed elements of the lower structure 320 will be explained with reference to FIGS. 8 and 9 below.

The common layer 340 may include a first portion 340a disposed outside the groove GR and a second portion 340b disposed inside the groove GR. For example, the first portion 340a may be disposed on the lower structure 320 outside the groove GR. Further, a portion of the second portion 340b may be disposed on the second barrier layer 314 inside the groove GR, another portion of the second portion 340b may be disposed on the first barrier layer 312 inside the groove GR, and still another portion of the second portion 340b may be disposed on the first plastic layer 311 inside the groove GR.

The encapsulation member 350 may cover an upper surface and a sidewall of the first portion 340a of the common layer 340, and an upper surface and a sidewall of the second portion 340b of the common layer 340. The encapsulation member 350 may further cover an upper surface and a sidewall of the first plastic layer 311, a lower surface, a sidewall, and an upper surface of the first barrier layer 312, a sidewall of the second plastic layer 313, a lower surface and a sidewall of the second barrier layer 314, and a sidewall of the lower structure 320 that are exposed by the groove GR.

Hereinafter, a cross-sectional structure of an organic light emitting display device according to an example embodiment will be explained in detail with reference to FIG. 7.

Figure 7:
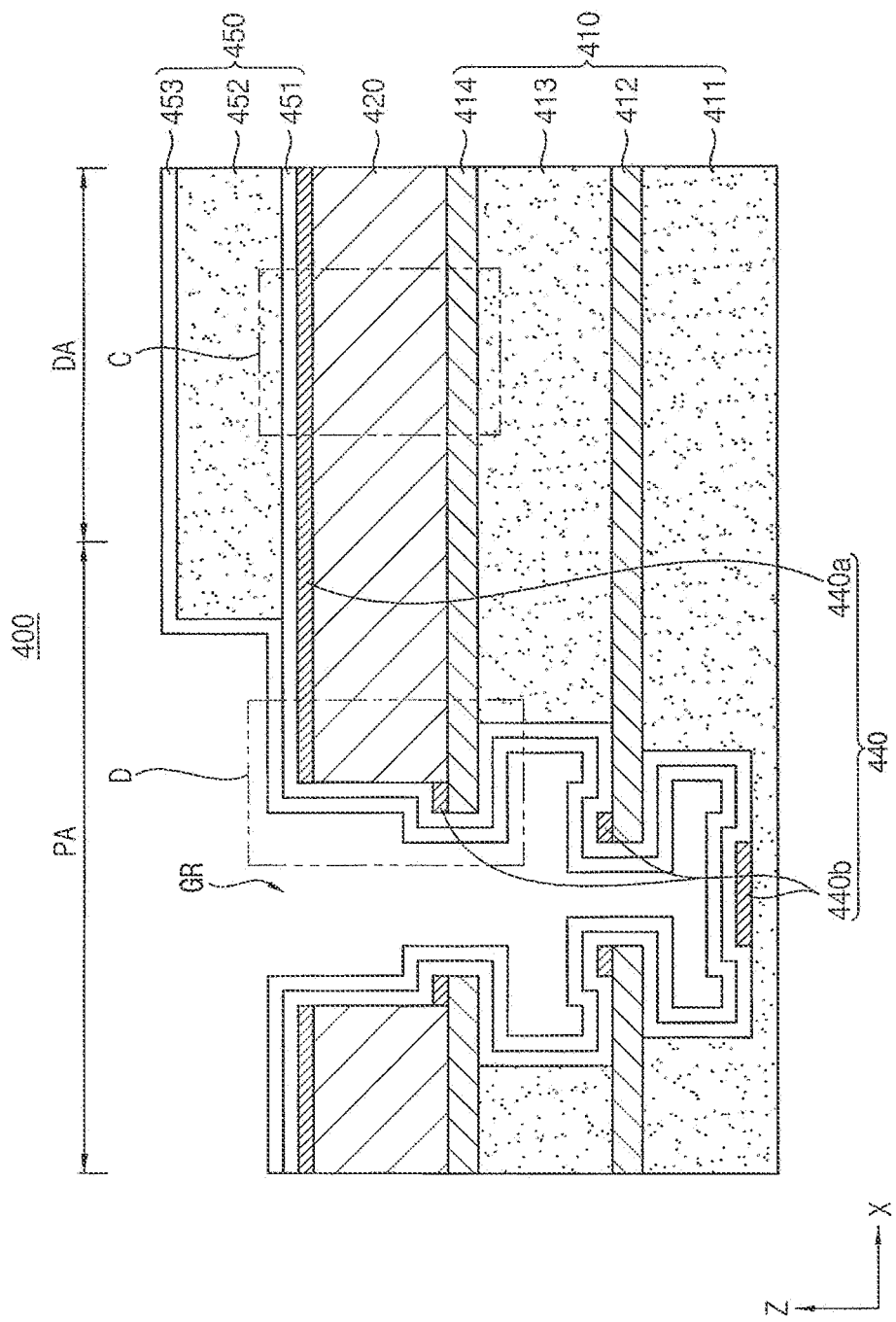
FIG. 7 illustrates a cross-sectional view of an organic light emitting display device according to an example embodiment.

FIG. 7 is a cross-sectional view illustrating an organic light emitting display device according to an example embodiment.

The example embodiment illustrated in FIG. 7 is substantially the same as the example embodiment illustrated in FIG. 6 except for elements of the encapsulation member, so redundant explanations may be omitted.

Referring to FIG. 7, an organic light emitting display device 400 according to an example embodiment may include a flexible substrate 410, a lower structure 420, a common layer 440, and an encapsulation member 450.

The encapsulation member 450 may include, for example, at least one inorganic layer and at least one organic layer. For example, the encapsulation member 450 may include a first inorganic layer 451, an organic layer 452, and a second inorganic layer 453.

The first inorganic layer 451 may be disposed on the common layer 440. The second inorganic layer 453 may be disposed on the first inorganic layer 451. Each of the first inorganic layer 451 and the second inorganic layer 453 may be formed of, for example, an inorganic material such as aluminum oxide, silicon oxide, silicon nitride, silicon oxynitride, silicon carbide, titanium oxide, zirconium oxide, zinc oxide, or the like.

The organic layer 452 may be disposed between the first inorganic layer 451 and the second inorganic layer 453. The organic layer 452 may be formed of, for example, an organic material such as epoxy, polyimide (PI), polyethylene terephthalate (PET), polycarbonate (PC), polyethylene (PE), polyacrylate, or the like.

The at least one inorganic layer of the encapsulation member 450 may cover a surface of the flexible substrate 410 that is exposed by the groove GR. For example, the first inorganic layer 451 and the second inorganic layer 453 may extend from an outside of the groove GR to an inside of the groove GR along a shape of the groove GR. In this case, the first inorganic layer 451 may cover a surface of the first plastic layer 411, a surface of the first barrier layer 412, a surface of the second plastic layer 413, a surface of the second barrier layer 414, the second portion 440b of the common layer 440, and a surface of the lower structure 420 which are exposed by the groove GR along the shape of the groove GR. Further, the second inorganic layer 453 may cover the first inorganic layer 451 along the shape thereof.

The at least one organic layer of the encapsulation member 450 may be disposed outside the groove GR. Thus, the at least one organic layer may not be disposed inside the groove GR. For example, the organic layer 452 may be selectively disposed outside the groove GR.

Hereinafter, the lower structure 420 and the common layer 440 in the display area DA and the peripheral area PA will be explained in detail.

Figure 8:
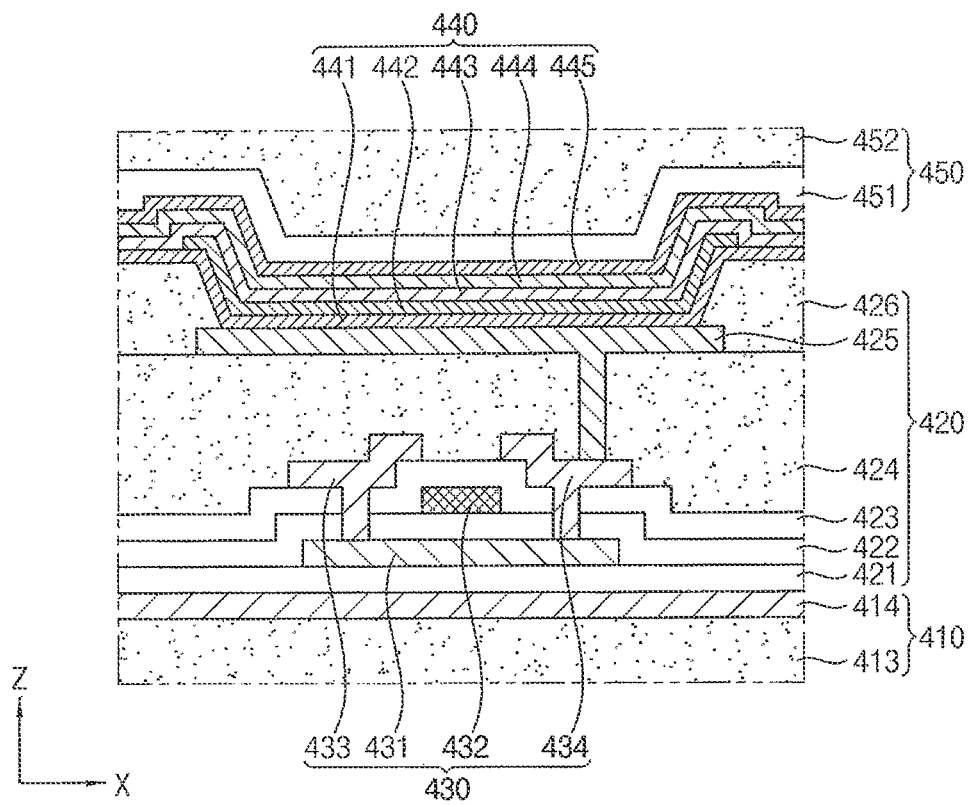
FIG. 8 illustrates a cross-sectional view of a region C in FIG. 7.
Figure 9:
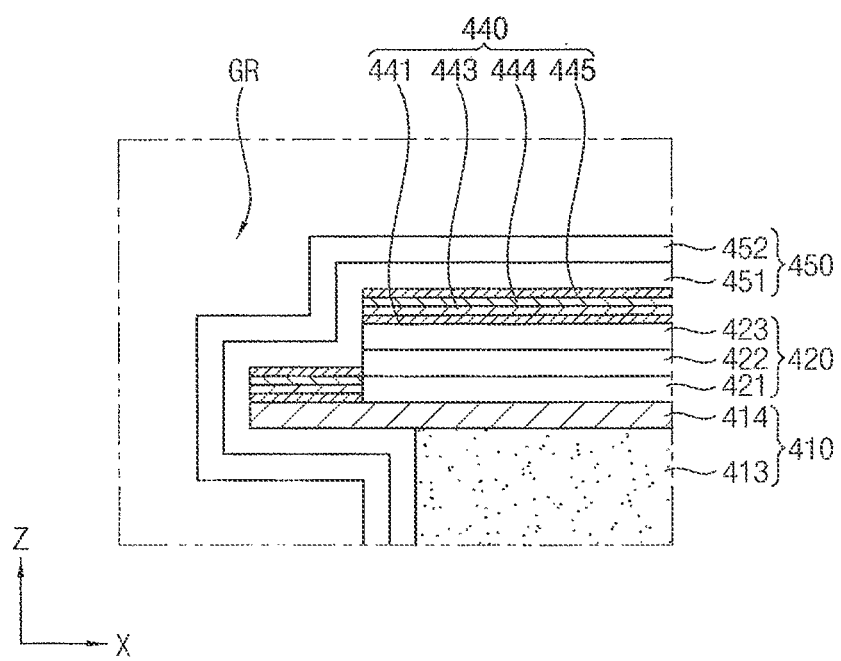
FIG. 9 illustrates a cross-sectional view of a region D in FIG. 7.

FIG. 8 is a cross-sectional view illustrating a region C in FIG. 7. FIG. 9 is a cross-sectional view illustrating a region D in FIG. 7. For example, FIG. 8 may illustrate one pixel of the organic light emitting display device.

Referring to FIGS. 8 and 9, an organic light emitting display device 400 according to an embodiment may include a flexible substrate 410, a lower structure 420, a thin film transistor 430, a common layer 440, and an encapsulation member 450.

The lower structure 420 may include a buffer layer 421, a gate insulation layer 422, an insulation interlayer 423, a planarization layer 424, a pixel electrode 425, and a pixel defining layer 426. The thin film transistor 430 may include an active pattern 431, a gate electrode 432, a source electrode 433, and a drain electrode 434.

The buffer layer 421 may be disposed on the flexible substrate 410. The buffer layer 421 may reduce or block penetration of impurities, moisture, external air, etc., from a lower portion of the flexible substrate 410. Further, the buffer layer 421 may provide a substantially flat surface on a top surface of the flexible substrate 410.

The active pattern 431 may be disposed on the buffer layer 421. The active pattern 431 may include semiconductor material, such as amorphous silicon, polycrystalline silicon, etc. However, the present embodiment is not limited thereto, and the active pattern 431 may include any suitable material. In another embodiment, the active pattern 431 may include an oxide semiconductor material, an organic semiconductor material, etc.

The gate insulation layer 422 covering the active pattern 431 may be disposed on the buffer layer 421. The gate insulation layer 422 may insulate the gate electrode 432 from the active pattern 431.

The gate electrode 432 may be disposed on the gate insulation layer 422. The gate electrode 432 may overlap a portion of the active pattern 431. The gate electrode 432 may include a conductive material including molybdenum (Mo), aluminum (Al), copper (Cu), titanium (Ti), etc.

The insulation interlayer 423 covering the gate electrode 432 may be disposed on the gate insulation layer 422. The insulation interlayer 423 may insulate the source electrode 433 and the drain electrode 434 from the gate electrode 432.

Each of the buffer layer 421, the gate insulation layer 422, and the insulation interlayer 423 may be formed of an inorganic material such as aluminum oxide, silicon oxide, silicon nitride, silicon oxynitride, silicon carbide, titanium oxide, zirconium oxide, zinc oxide, or the like.

The buffer layer 421, the gate insulation layer 422, and the insulation interlayer 423 may extend from the display area DA to the peripheral area PA. An edge of the buffer layer 421, the gate insulation layer 422, and the insulation interlayer 423 may be adjacent to the groove GR.

Referring to FIG. 9, in an example embodiment, the edge of the buffer layer 421, the gate insulation layer 422, and the insulation interlayer 423 may be spaced apart from an edge of the second barrier layer 414. Thus, as shown in FIG. 9, the second barrier layer 414 may protrude laterally with respect to the buffer layer 421, the gate insulation layer 422, and the insulation interlayer 423 at the groove GR.

The source electrode 433 and the drain electrode 434 may be disposed on the insulation interlayer 423. The source electrode 433 and the drain electrode 434 may be electrically connected to the active pattern 431. For example, a first contact hole exposing a first region of the active pattern 431 and a second contact hole exposing a second region of the active pattern 431 may be formed in the gate insulation layer 422 and the insulation interlayer 423, and the source electrode 433 and the drain electrode 434 may contact the active pattern 431 through the first contact hole and the second contact hole, respectively.

The planarization layer 424 covering the source electrode 433 and the drain electrode 434 may be disposed on the insulation interlayer 423. The planarization layer 424 may remove a step caused by the thin film transistor 430, and may provide a substantially flat surface on a top surface of the thin film transistor 430. The planarization layer 424 may protect the source electrode 433 and the drain electrode 434.

An organic light emitting element may be disposed on the planarization layer 424. The organic light emitting element may include the pixel electrode 425, an organic light emitting layer 442, and a common electrode 444.

The pixel electrode 425 may be disposed on the planarization layer 424. The pixel electrode 425 may be electrically connected to the drain electrode 434. For example, a third contact hole exposing the drain electrode 434 may be formed in the planarization layer 424, and the pixel electrode 425 may contact the drain electrode 434 through the third contact hole. The pixel electrode 425 may be formed of various conductive materials. The pixel electrode 425 may have various shapes. For example, the pixel electrode 425 may be patterned per each pixel to have an island shape.

The pixel defining layer 426 covering the pixel electrode 426 may be disposed on the planarization layer 424. The pixel defining layer 426 may include an opening exposing a portion of the pixel electrode 425.

Each of the planarization layer 424 and the pixel defining layer 426 may be formed of an organic material. The planarization layer 424 and the pixel defining layer 426 may be disposed only in the display area DA, and may not extend to the peripheral area PA.

The organic light emitting layer 442 may be disposed on the pixel electrode 426. The organic light emitting layer 442 may be formed of, for example, low molecular organic material or high molecular organic material such as poly(3, 4-ethylenedioxythiophene) (PEDOT). The organic light emitting layer 442 may be formed individually per each pixel.

The common electrode 444 may be disposed on the organic light emitting layer 442. The common electrode 444 may be also disposed on the pixel defining layer 426, and may be formed throughout a plurality of pixels.

The organic light emitting element may further include a first organic function layer 441 and a second organic function layer 443. The first organic function layer 441 may be disposed between the pixel electrode 425 and the organic light emitting layer 442, and the second organic function layer 443 may be disposed between the organic light emitting layer 442 and the common electrode 444.

The first organic function layer 441 may include a hole injection layer (HIL) and/or a hole transport layer (HTL). The second organic function layer 443 may include an electron transport layer (ETL) and/or an electron injection layer (EIL). The first organic function layer 441 and the second organic function layer 443 may be formed throughout a plurality of pixels.

A capping layer 445 may be disposed on the common electrode 444. The capping layer 445 may protect the common electrode 444, and may control a refractive index of visual light emitted from the organic light emitting layer 442 in order to improve light efficiency.

The first organic function layer 441, the second organic function layer 443, the common electrode 444, and the capping layer 445 may extend from the display area DA to the peripheral area PA. At least one of the first organic function layer 441, the second organic function layer 443, the common electrode 444, and the capping layer 445 may be disposed throughout outside and inside of the groove GR. FIG. 9 illustrates that the common layer 440 including the first organic function layer 441, the second organic function layer 443, the common electrode 444, and the capping layer 445 is disposed throughout outside and inside of the groove GR, however, the present embodiment is not limited thereto.

The encapsulation member 450 may be disposed on the capping layer 445.

Hereinafter, a method of manufacturing an organic light emitting display device according to an example embodiment will be explained with reference to FIGS. 10A, 10B, 10C, 10D, 10E, 10F, 10G, and 10H.

FIGS. 10A, 10B, 10C, 10D, 10E, 10F, 10G, and 10H are cross-sectional views of stages in a method of manufacturing an organic light emitting display device according to an example embodiment.

For example, FIGS. 10A, 10B, 10C, 10D, 10E, 10F, 10G, and 10H illustrate a method of manufacturing the organic light emitting display device 400 in FIG. 7. The method of manufacturing the organic light emitting display device 400 is described as an example. Thus, the description in association with FIGS. 10A through 10H may apply to the organic light emitting display devices 100, 200, and 300.

Referring to FIG. 10A, a carrier substrate 470 may be prepared, and the flexible substrate 410 may be formed on the carrier substrate 470.

The flexible substrate 410 may be formed of a plastic material is bendable or stretchable when heat is applied thereto. Thus, it may be difficult to precisely form thin film patterns such as various electrodes or conductive wirings on the flexible substrate 410. Accordingly, various thin film patterns may be formed on the flexible substrate 410 that is adhered to the carrier substrate 470.

Firstly, the first plastic layer 411 may be formed on the carrier substrate 470. The first plastic layer 411 may be formed by, for example, coating and curing a plastic polymer solution or by laminating a polymer film on the carrier substrate 470. The curing may be formed by, for example, using any of various methods such as thermal curing, UV curing, or electron-beam curing.

Then, the first barrier layer 412 may be formed on the first plastic layer 411. The first barrier layer 412 may be formed of, for example, an inorganic material by using, for example, chemical vapor deposition (CVD), plasma enhanced chemical vapor deposition (PECVD), or atomic layer deposition (ALD).

Then, the second plastic layer 413 may be formed on the first barrier layer 412, and the second barrier layer 414 may be formed on the second plastic layer 413. The second plastic layer 413 may be formed of, for example, the same material by using the same method as those of the first plastic layer 411. The second barrier layer 414 may be formed of the same material by using the same method as those of the first barrier layer 412.

Then, the lower structure 420 may be formed on the flexible substrate 410. The active pattern 431 in FIG. 8 may be formed by various methods depending on a material. For example, the active pattern 431 may be formed by using plasma enhanced chemical vapor deposition, atmospheric pressure chemical vapor deposition, low pressure chemical vapor deposition, or the like when including amorphous silicon, oxide semiconductor, or the like. When the active pattern 431 includes polycrystalline silicon, amorphous silicon may be crystallized by using a crystallizing method such as rapid thermal annealing, solid phase crystallization, excimer laser annealing, metal induced annealing, or the like.

The gate electrode 432 in FIG. 8, the source electrode 433 in FIG. 8, the drain electrode 434 in FIG. 8, the pixel electrode 425 in FIG. 8, etc. may be deposited by chemical vapor deposition, plasma enhanced chemical vapor deposition, atomic layer deposition, or the like, and may be patterned by photolithography.

Figure 10B:
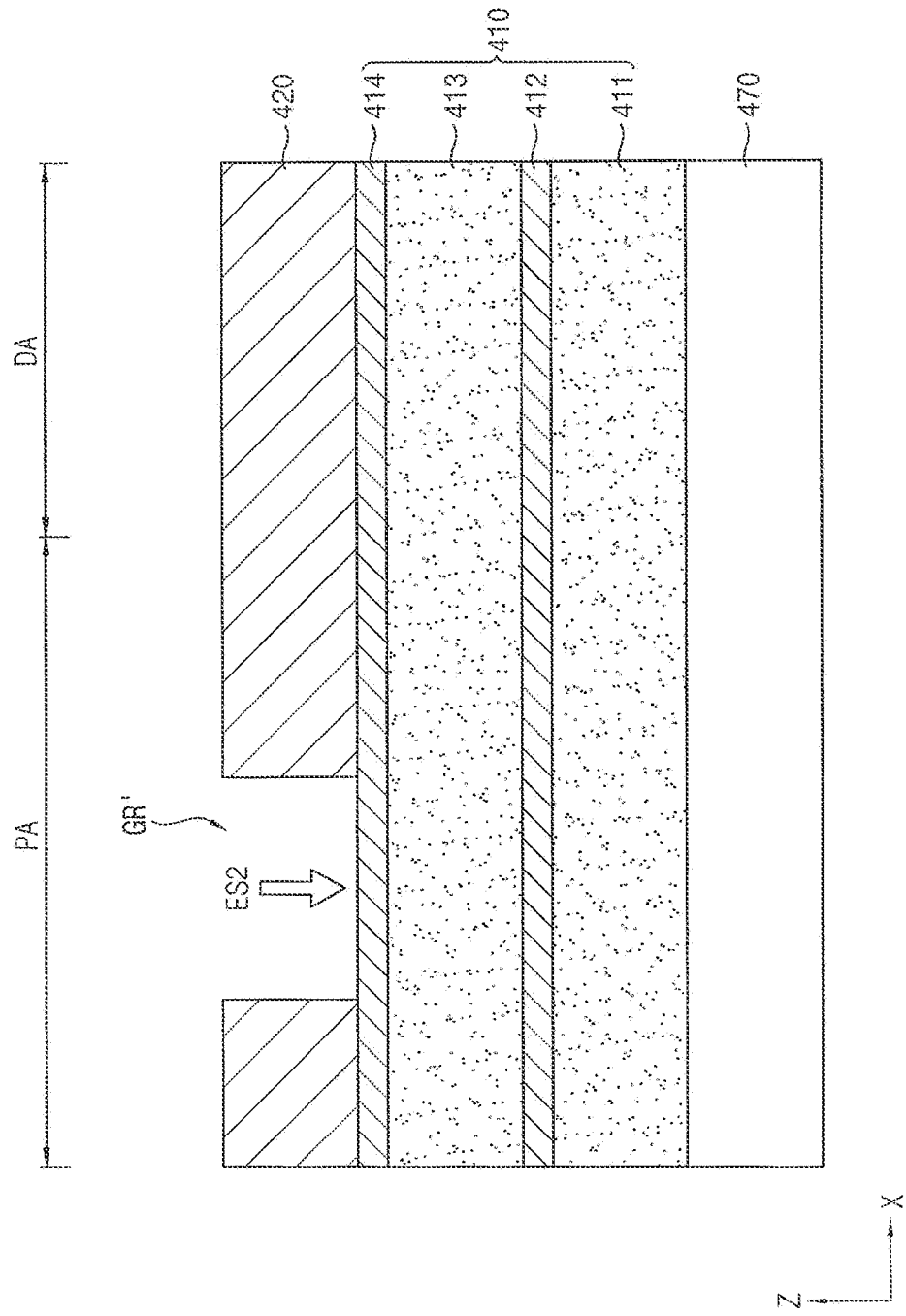

Referring to FIG. 10B, a preliminary groove GR' passing through the lower structure 420 may be formed.

The preliminary groove GR' may be formed in the peripheral area PA to correspond to the groove GR. The preliminary groove GR' may be formed by, for example, using a first etching source ES1 illustrated in FIG. 10A. The first etching source ES1 may be various, and may include laser irradiation, for example, laser ablation.

Figure 10C:
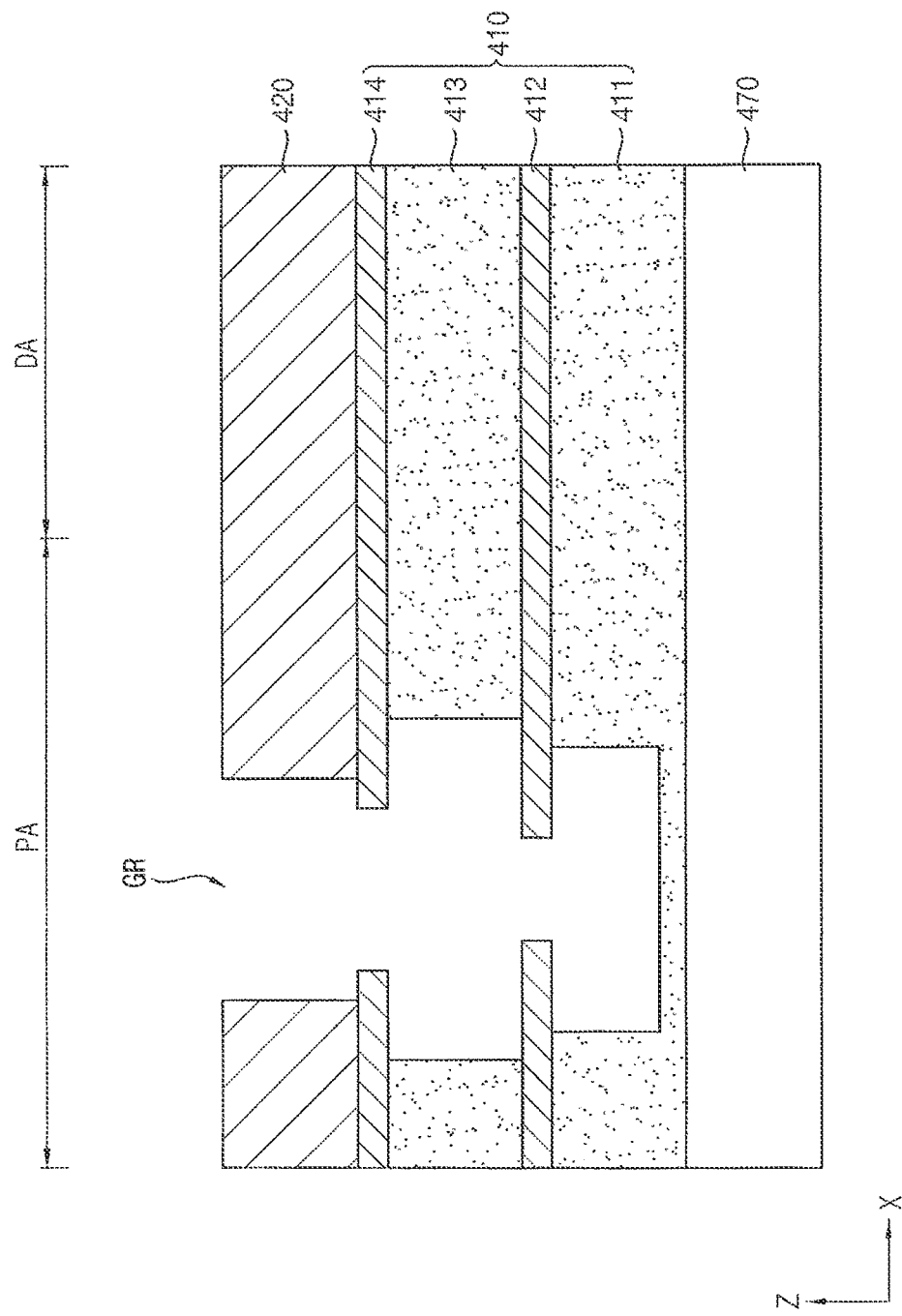

Referring to FIG. 10C, the undercut groove GR may be formed in the flexible substrate 410.

The groove GR may be formed on the flexible substrate 410 exposed by the preliminary groove GR' by using a second etching source ES2 illustrated in FIG. 10B. The second etching source ES2 may be various, and may include laser irradiation.

The groove GR may be formed in the first plastic layer 411, the first barrier layer 412, the second plastic layer 413, and the second barrier layer 414. For example, the groove GR may correspond to a portion of a thickness of the first plastic layer 411, an entirety of a thickness of the first barrier layer 412, an entirety of a thickness of the second plastic layer 413, and an entirety of a thickness of the second barrier layer 414. In this case, an upper surface and a sidewall of the first plastic layer 411, a lower surface, a sidewall, and an upper surface of the first barrier layer 412, a sidewall of the second plastic layer 413, and a lower surface and a sidewall of the second barrier layer 414 may be exposed by the groove GR.

The groove GR may be integrally formed in the first plastic layer 411, the second barrier layer 412, the second plastic layer 413, and the second barrier layer 414. For example, the groove GR, which is formed in the first plastic layer 411, the first barrier layer 412, the second plastic layer 413, and the second barrier layer 414, may be formed with one process in which laser may be irradiated from top of the flexible substrate 410. Materials of the first and second plastic layers 411 and 413 and the first and second barrier layers 412 and 414 are different to each other, so that laser absorption rates thereof may be different to each other. Accordingly, a width of the groove GR may not be uniform.

A laser absorption rate of the first plastic layer 411 may be greater than a laser absorption rate of the first barrier layer 412. Therefore, the first plastic layer 411 may be undercut with respect to the first barrier layer 412 at the groove GR. Thus, the first barrier layer 412 may be protruded with respect to the first plastic layer 411 at the groove GR. A laser absorption rate of the second plastic layer 413 may be greater than a laser absorption rate of the second barrier layer 414. Therefore, the second plastic layer 413 may be undercut with respect to the second barrier layer 414 at the groove GR. Thus, the second barrier layer 414 may be protruded with respect to the second plastic layer 413 at the groove GR.

When the laser is irradiated over several times from top of the flexible substrate 410, an upper portion of the flexible substrate 410 may be more exposed to the laser than a lower portion of the flexible substrate 410. Therefore, a width of the groove GR may be decrease from the upper portion of the flexible substrate 410 to the lower portion of the flexible substrate 410. For example, a width of the groove GR at the second barrier layer 414 may be greater than a width of the groove GR at the first barrier layer 412. Further, a width of the groove GR at the second plastic layer 413 may be greater than a width of the groove GR at the first plastic layer 411.

Figure 10D:
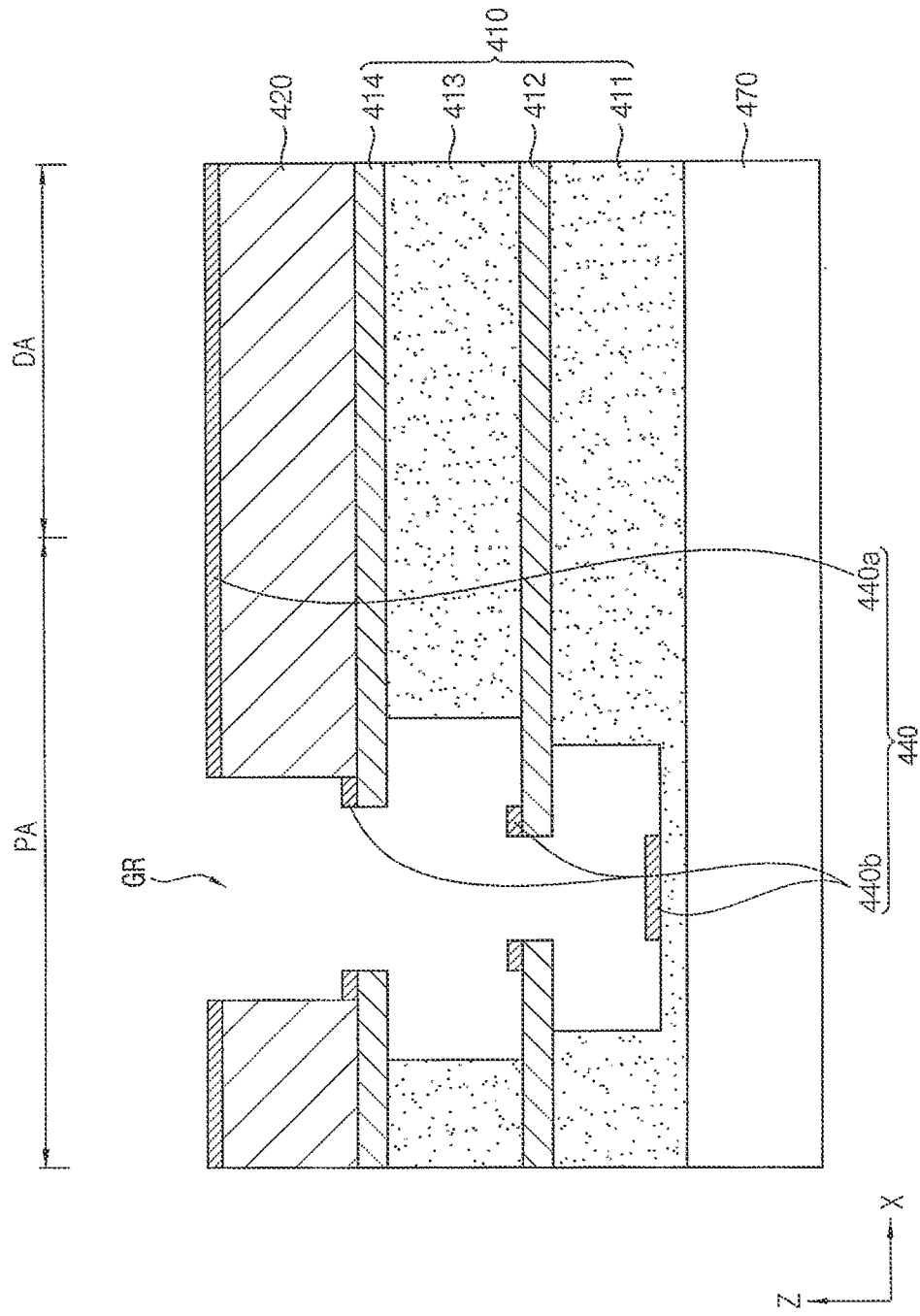

Referring to FIG. 10D, the common layer 440 disconnected by the groove GR may be formed on the flexible substrate 410.

As described above, the common layer 440 may include at least one of the first organic function layer 441 in FIG. 8, the second organic function layer 443 in FIG. 8, the common layer 444 in FIG. 8, and the capping layer 445 in FIG. 8. The common layer 440 may be formed on an entire surface of the flexible substrate 410 throughout the display area DA and the peripheral area PA. The common layer 440 may be formed by various methods such as deposition method, coating method, printing method, light thermal transfer method.

When the common layer 440 extends from the display area DA to the peripheral area PA, moisture and/or oxygen may be injected to an edge of the common layer 440 from outside, and the moisture and/or oxygen may be transferred from the peripheral area PA to the display area DA through the common layer 440 thereby degrading the pixels. Therefore, a path through which the moisture and/or oxygen is transferred is blocked.

As described above, the groove GR may be formed in the peripheral area PA, and the groove GR may have an undercut shape. Accordingly, the first portion 440a of the common layer 440 formed outside the groove GR and the second portion 440b of the common layer 440 formed inside the groove GR may be disconnected form each other. In this case, the common layer 440 may be disconnected without additional process for disconnecting the common layer 440, and a path of transferring the moisture and/or oxygen may be blocked.

Figure 10E:
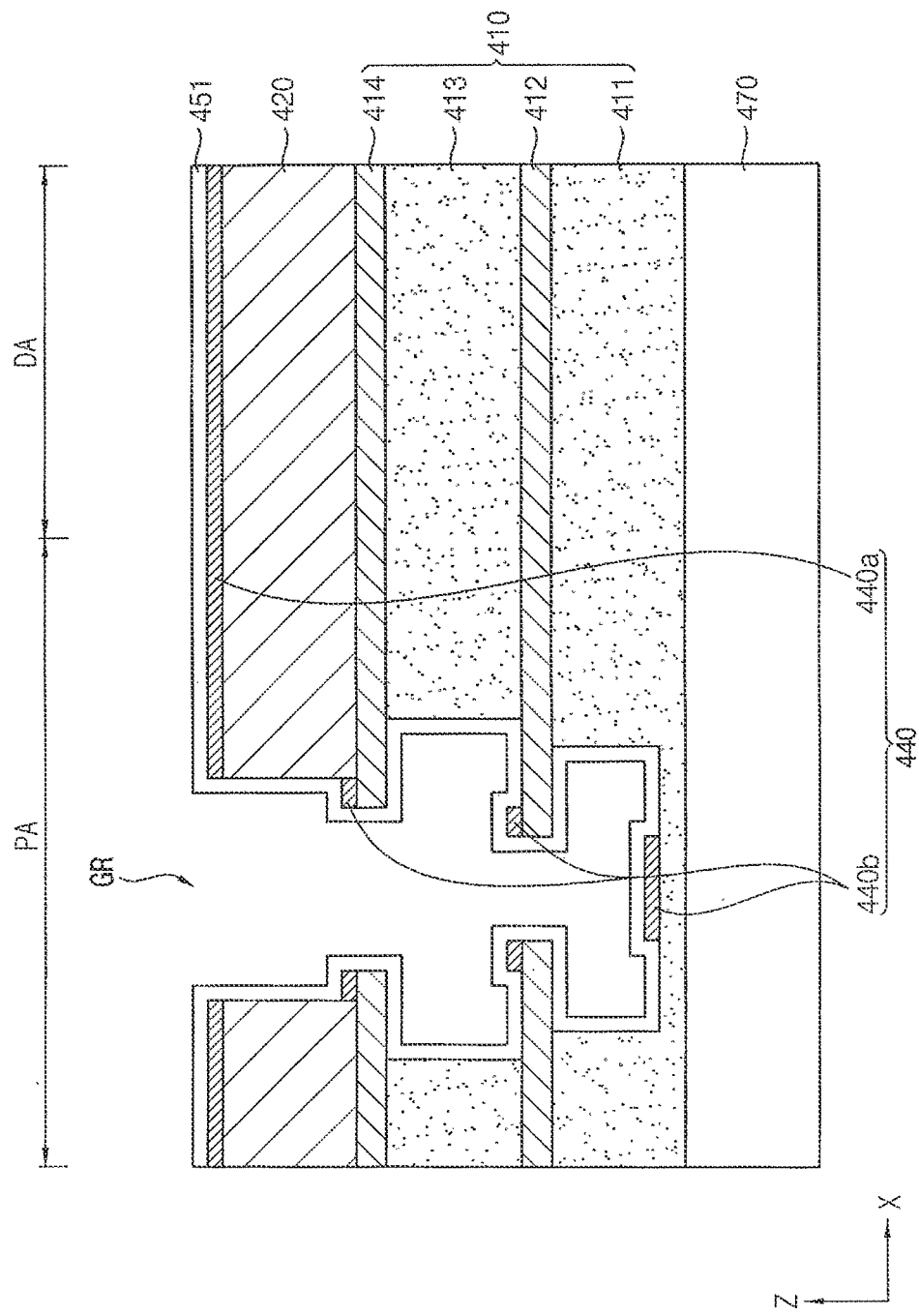
Figure 10F:
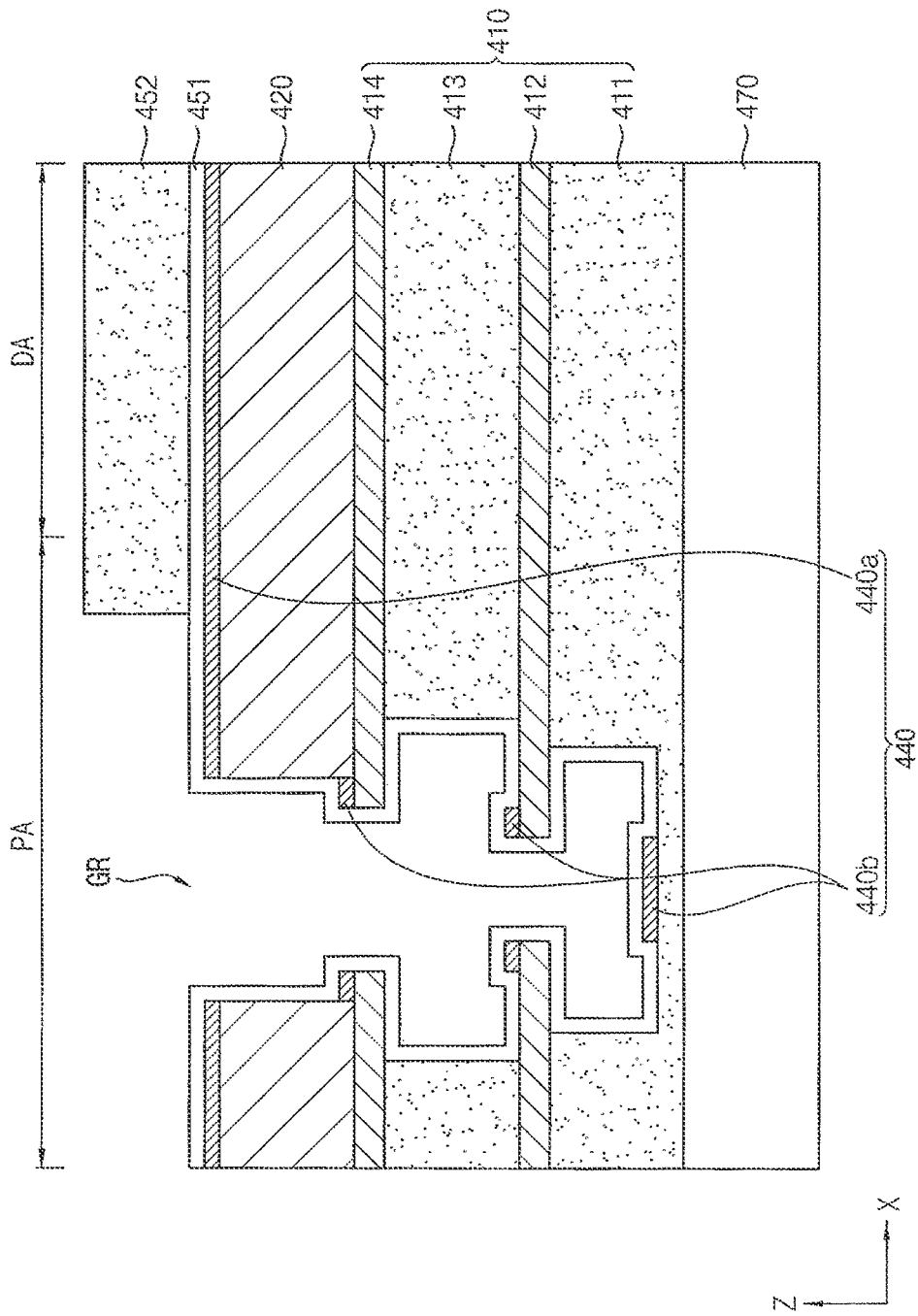
Figure 10G:
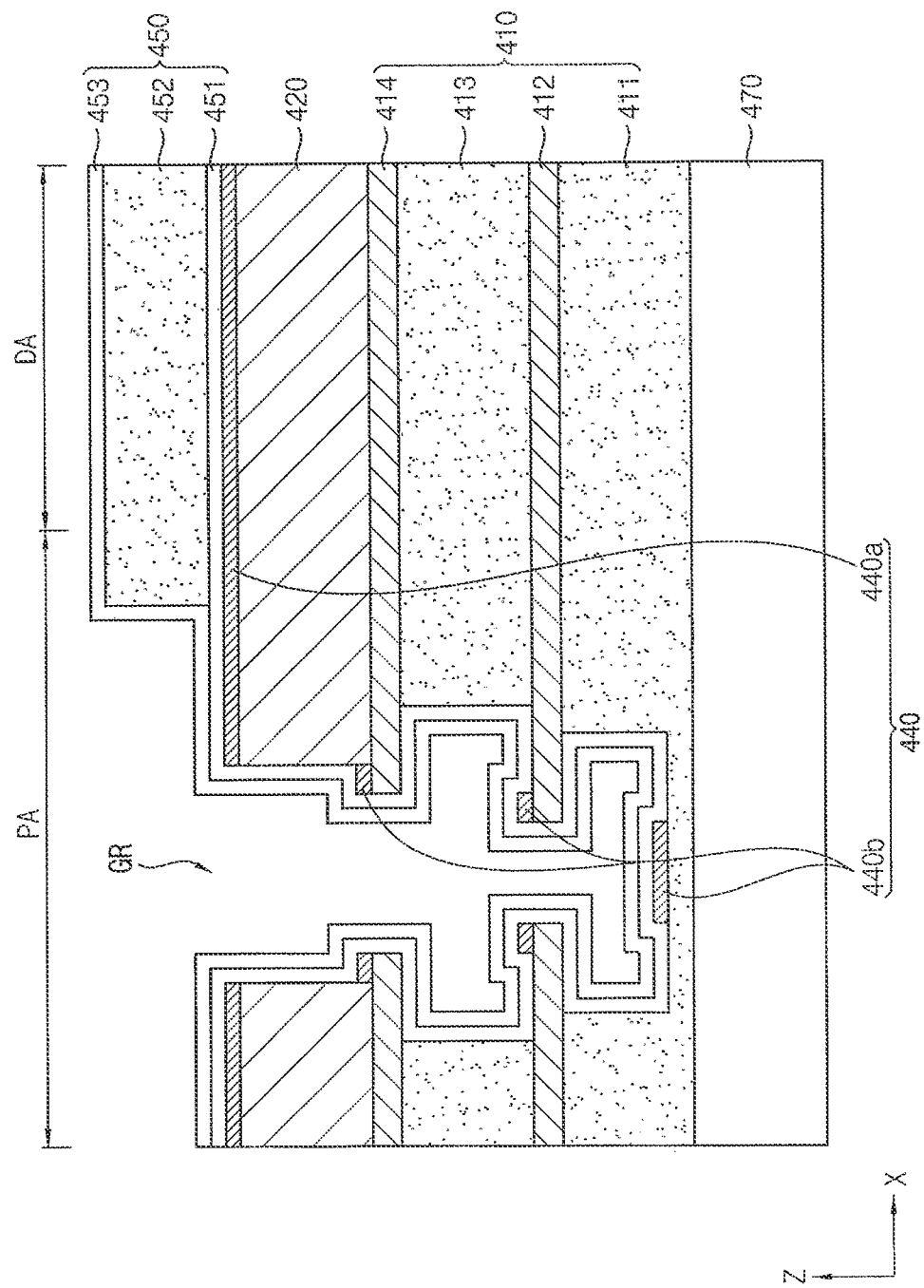

Referring to FIGS. 10E, 10F, and 10G, the encapsulation member 450 covering the common layer 440 may be formed thereon.

Firstly, as illustrated in FIG. 10E, the first inorganic layer 451 may be formed on the common layer 440. The first inorganic layer 451 may be formed throughout an outside and an inside of the groove GR. For example, the first inorganic layer 451 may cover the first portion 440a of the common layer 440 formed outside the groove GR, and may cover the second portion 440b of the common layer 440 formed inside the groove GR, and a surface of the flexible substrate 410 and a surface of the lower structure 420 which are exposed by the groove GR. The first inorganic layer 451 may be formed of an inorganic material by using various deposition methods such as chemical vapor deposition, atomic layer deposition, sputtering, or the like.

Then, as illustrated in FIG. 10F, the organic layer 452 may be formed on the first inorganic layer 451. The organic layer 452 may be formed only outside the groove GR. Thus, the organic layer 452 may not be formed inside the groove GR. The organic layer 452 may be formed of an organic material by using, for example, inkjet printing, slot die coating, or the like.

Then, as illustrated in FIG. 10G, the second inorganic layer 453 covering the organic layer 452 may be formed on the first inorganic layer 451. The second inorganic layer 453 may be formed throughout an outside and an inside of the groove GR. For example, the second inorganic layer 453 may be formed along a profile of the first inorganic layer 451 formed inside the groove GR. The second inorganic layer 453 may be formed of the same material by using the same method as those of the first inorganic layer 451.

The encapsulation member 450 may be formed along a concavo-convex shape inside the groove GR. Thus, the contact area between the flexible substrate 410 and the encapsulation member 450 may increase in comparison with not forming the groove GR. Accordingly, adhesion between the flexible substrate 410 and the encapsulation member 450 may increase.

Figure 10H:
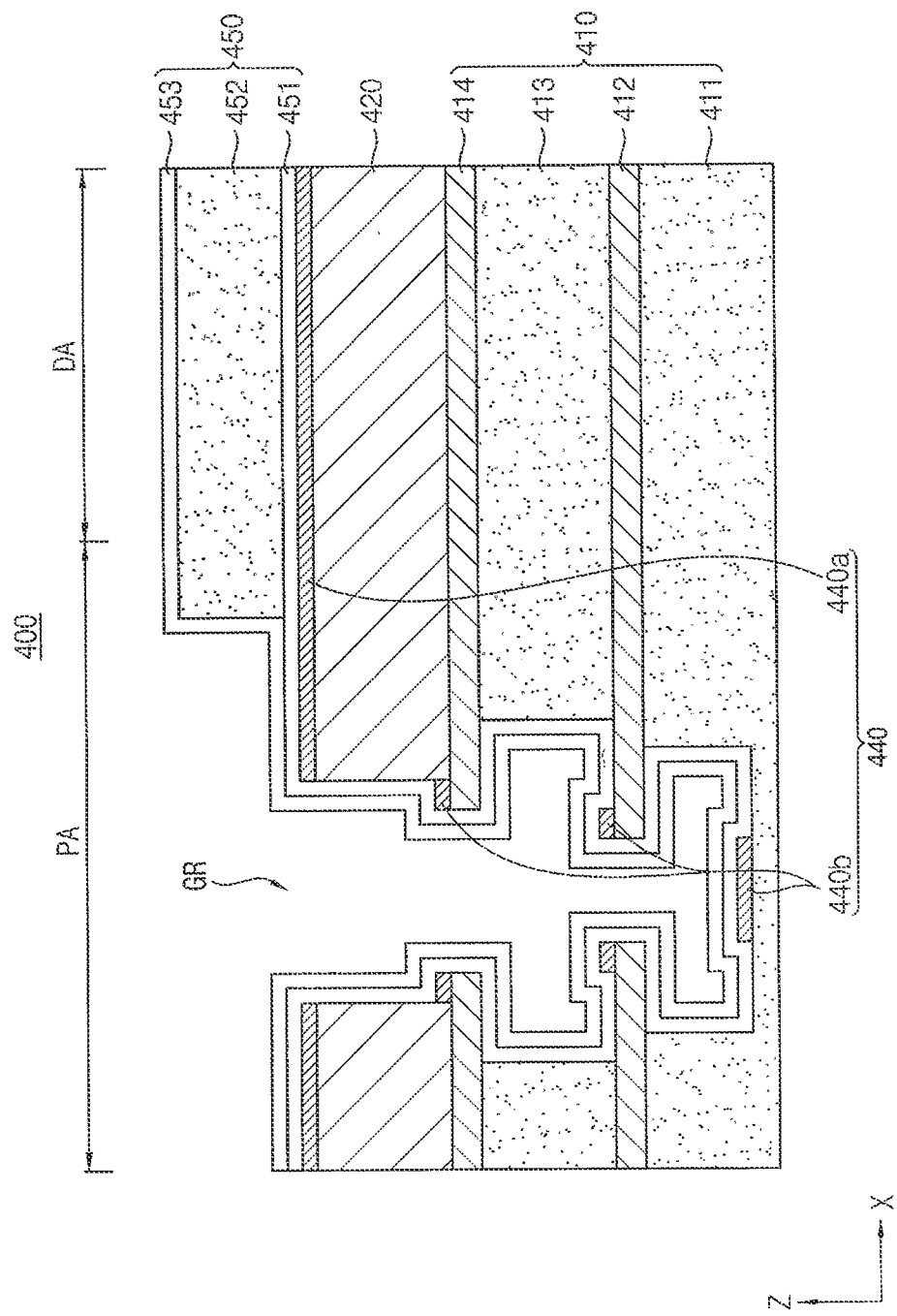

Referring to FIG. 10H, the carrier substrate 470 may be separated from the flexible substrate 410.

In order to separate the carrier substrate 470 from the flexible substrate 410, laser may be irradiated to a surface of the carrier substrate 470 which is opposite to a surface on which the flexible substrate 410 is formed. The first plastic layer 411 and the second plastic layer 413 may absorb the laser, therefore, the coherence between the flexible substrate 410 and the carrier substrate 470 may be reduced. Then, the carrier substrate 470 may be separated from the flexible substrate 410 by using mechanical stress.

Hereinafter, a cross-sectional structure of an organic light emitting display device according to an embodiment will be explained with reference to FIG. 11.

Figure 11:
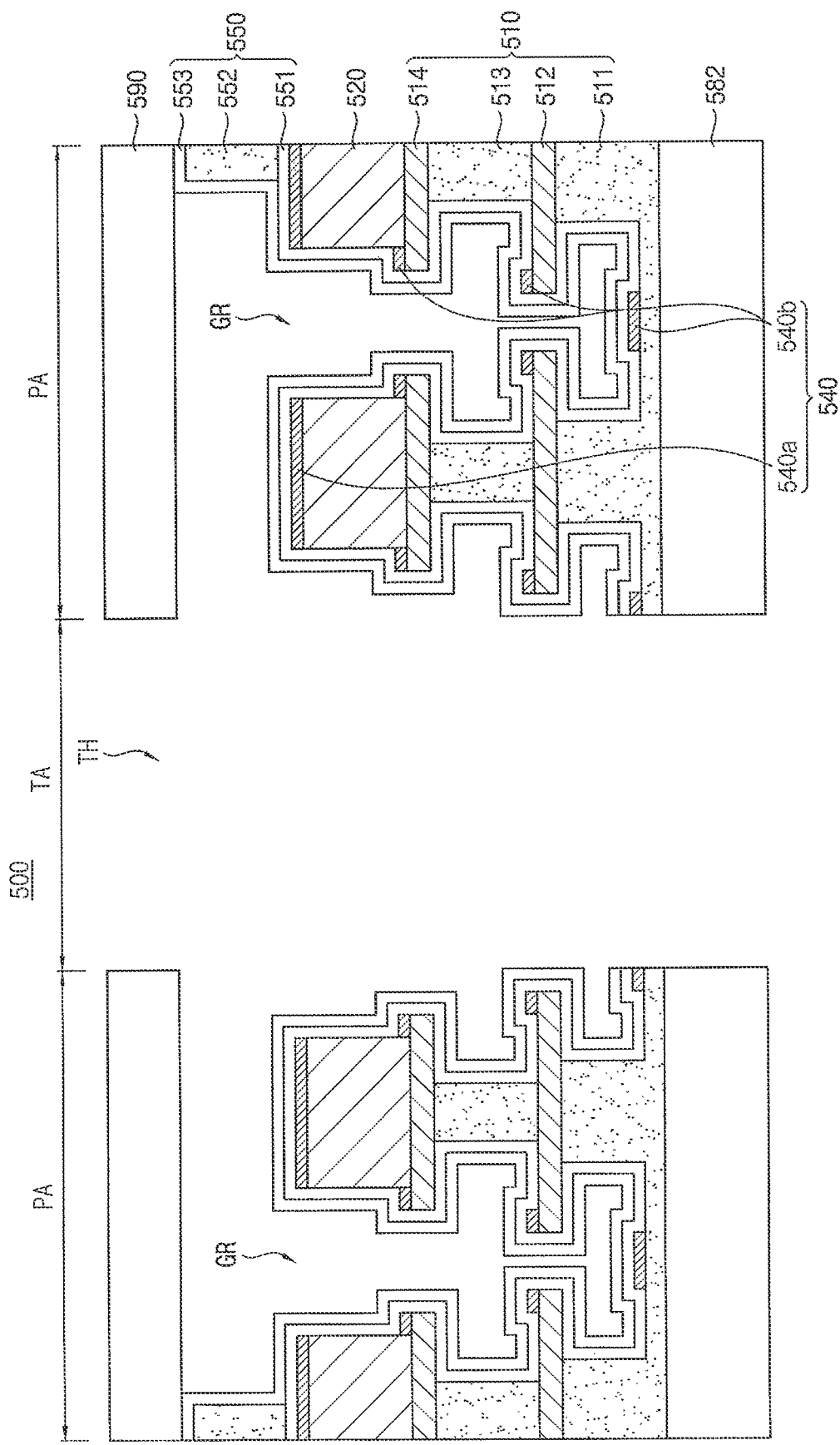
FIG. 11 illustrates a cross-sectional view of an organic light emitting display device according to an example embodiment.

FIG. 11 is a cross-sectional view illustrating an organic light emitting display device according to an embodiment.

An embodiment illustrated in FIG. 11 is substantially the same as the embodiment illustrated in FIG. 7 except for a lower protective film, a polarizing member, and a through hole, so that redundant explanations will be omitted.

Referring to FIG. 11, an organic light emitting display device 500 may include a flexible substrate 510, a common layer 540, an encapsulation member 550, a lower protective film 582, and a polarizing member 590.

The lower protective film 582 may be disposed on a lower surface of the flexible substrate 510. The lower protective film 582 may absorb an impact from outside to prevent the organic light emitting display device 500 from being damaged. The lower protective film 582 may be formed of a material containing air such as cushion, sponge, etc. in order to absorb an impact.

The polarizing member 590 may be disposed on the encapsulation member 550. The polarizing member 590 may cause destructive interference of external light to reduce or extinguish it. Thus, the polarizing member 590 may suppress reflection of external light.

The organic light emitting display device 500 may include a through hole TH. The through hole TH may correspond to an entirety of a thickness of the organic light emitting display device 500. For example, the through hole TH may pass through the lower protective film 582, the flexible substrate 510, the common layer 540, the encapsulation member 550, and the polarizing member 590. The through hole TH may define the through area TA of the organic light emitting display device 500.

At least a portion of the peripheral area PA which is exposed by the through hole TH may be covered by the encapsulation member 550. For example, as illustrated in FIG. 11, a side portion of the flexible substrate 510, a side portion of the lower structure 520, and a side portion of the common layer 540 may be covered by the first inorganic layer 551 and the second inorganic layer 553 of the encapsulation member 550. Accordingly, the encapsulation member 550 may substantially block or decrease an inflow of moisture and/or oxygen into an edge of the peripheral area PA which is exposed by the through hole TH.

Hereinafter, a method of manufacturing an organic light emitting display device according to an example embodiment will be explained with reference to FIGS. 12A, 12B, 12C, 12D, 12E, and 12F.

FIGS. 12A, 12B, 12C, 12D, 12E, and 12F are cross-sectional views of stages in a method of manufacturing an organic light emitting display device according to an example embodiment.

For example, FIGS. 12A, 12B, 12C, 12D, 12E, and 12F illustrate a method of manufacturing the organic light emitting display device 500 in FIG. 11. Description of elements of a method of manufacturing the organic light emitting display device 500 with reference to FIGS. 12A, 12B, 12C, 12D, 12E, and 12F, which are substantially the same as or similar to those of the method of manufacturing the organic light emitting display device 400 with reference to FIGS. 10A, 10B, 10C, 10D, 10E, 10F, 10G, and 10H, may not be repeated.

Figure 12A:
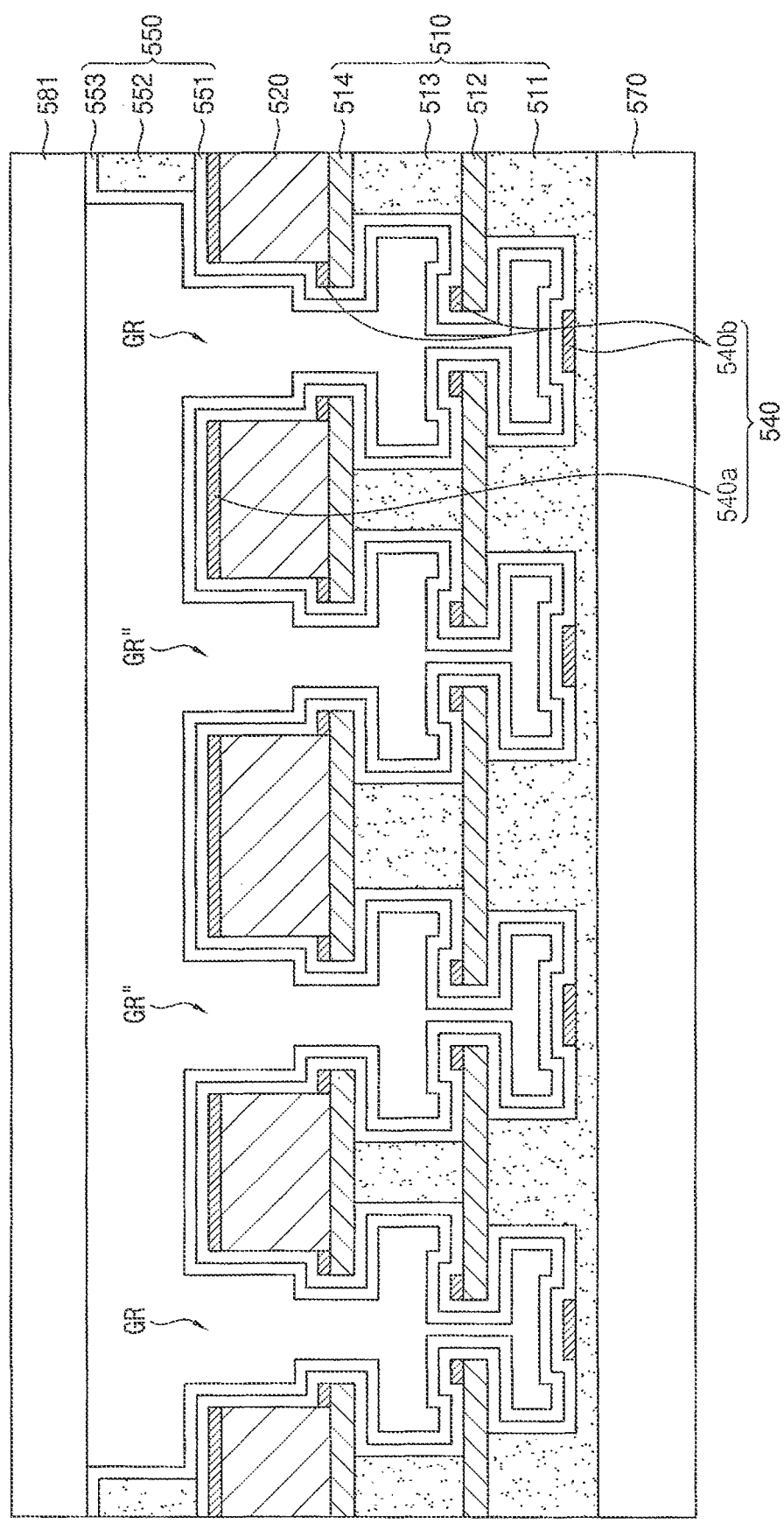
FIGS. 12A, 12B, 12C, 12D, 12E, and 12F illustrate cross-sectional views of stages in a method of manufacturing an organic light emitting display device according to an example embodiment.

Referring to FIG. 12A, an upper protective film 581 may be attached on the encapsulation member 550.

The upper protective film 581 may be attached on the encapsulation member 550 of the organic light emitting display device 500 on which the carrier substrate 570 is attached and a plurality of grooves GR and GR" are formed. As illustrated in FIG. 12A, a temporary groove GR" may be formed as well as a groove GR corresponding to the groove GR illustrated in FIG. 11 in the organic light emitting display device 500. The groove GR may surround the temporary groove GR". At least a portion of the temporary groove GR" may be exposed by the through hole TH when forming the through hole TH as described below.

The upper protective film 581 may protect the encapsulation member 550. The encapsulation member 550 may be easily damaged by scratch, foreign substance, etc. during a manufacturing process of the organic light emitting display device 500. The upper protective film 581 may be disposed to prevent the damage of the encapsulation member 550.

Figure 12B:
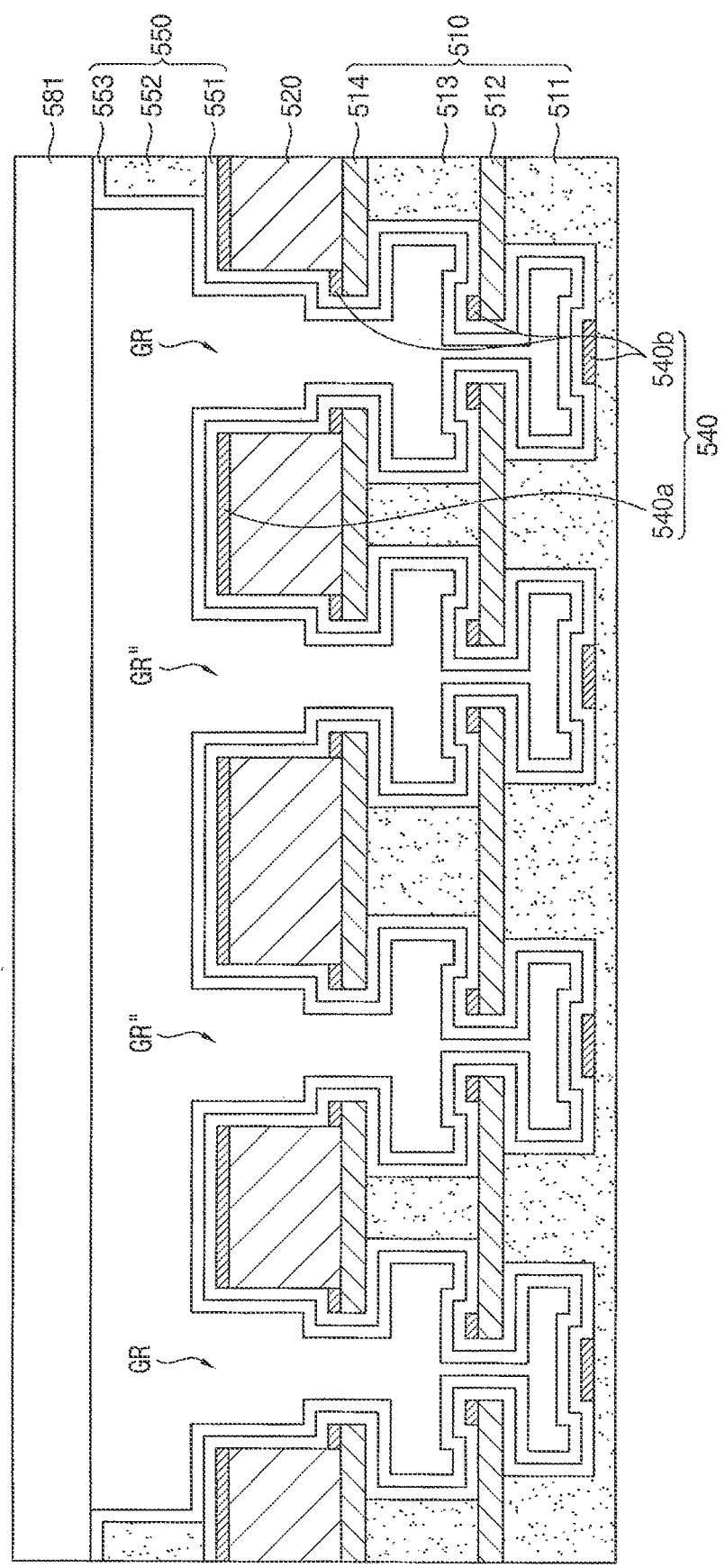
Figure 12C:
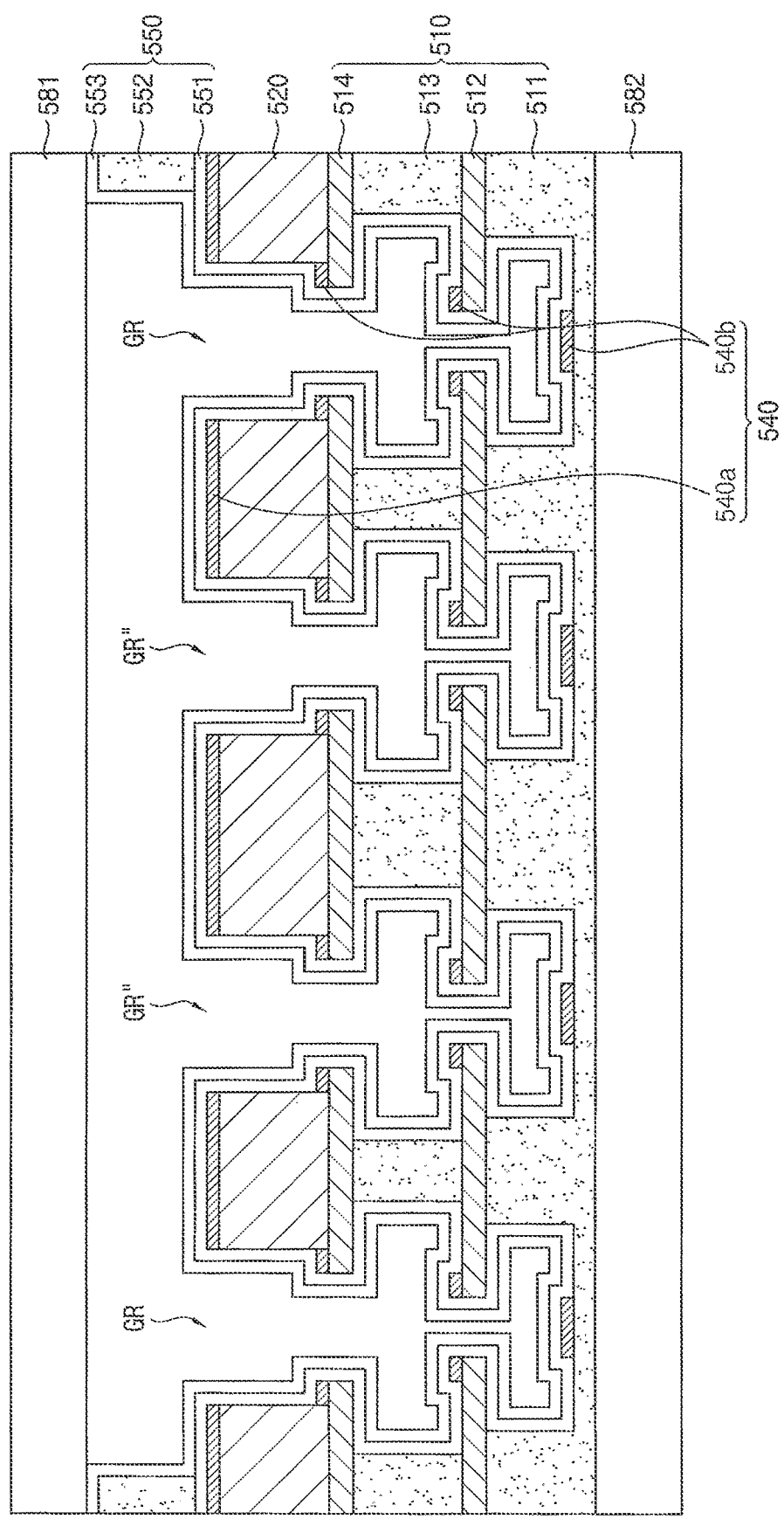

Referring to FIGS. 12B and 12C, the carrier substrate 570 may be separated from the flexible substrate 510, and the lower protective film 582 may be attached to a surface of the flexible substrate 510 on which the carrier substrate 570 is separated. The lower protective film 582 may prevent the surface of the flexible substrate 510 from being damaged during the process progress.

Figure 12D:
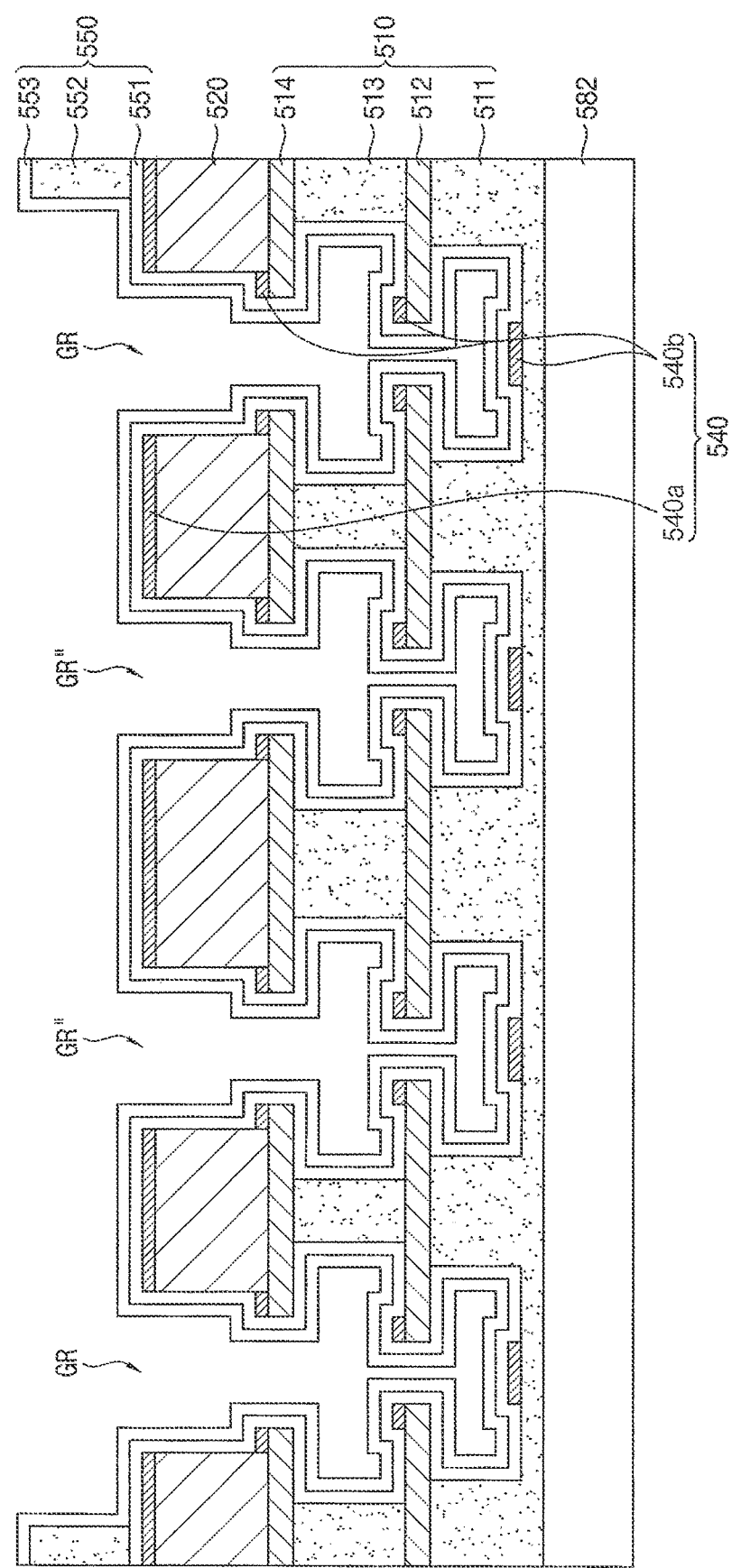

Referring to FIG. 12D, the upper protective film 581 may be removed. The upper protective film 581 may be formed to prevent damage, e.g., scratch, of the encapsulation member 550 during the process progress. The upper protective film 581 may be removed before forming function members, e.g., a polarizing member, on the encapsulation member 550.

Figure 12E:
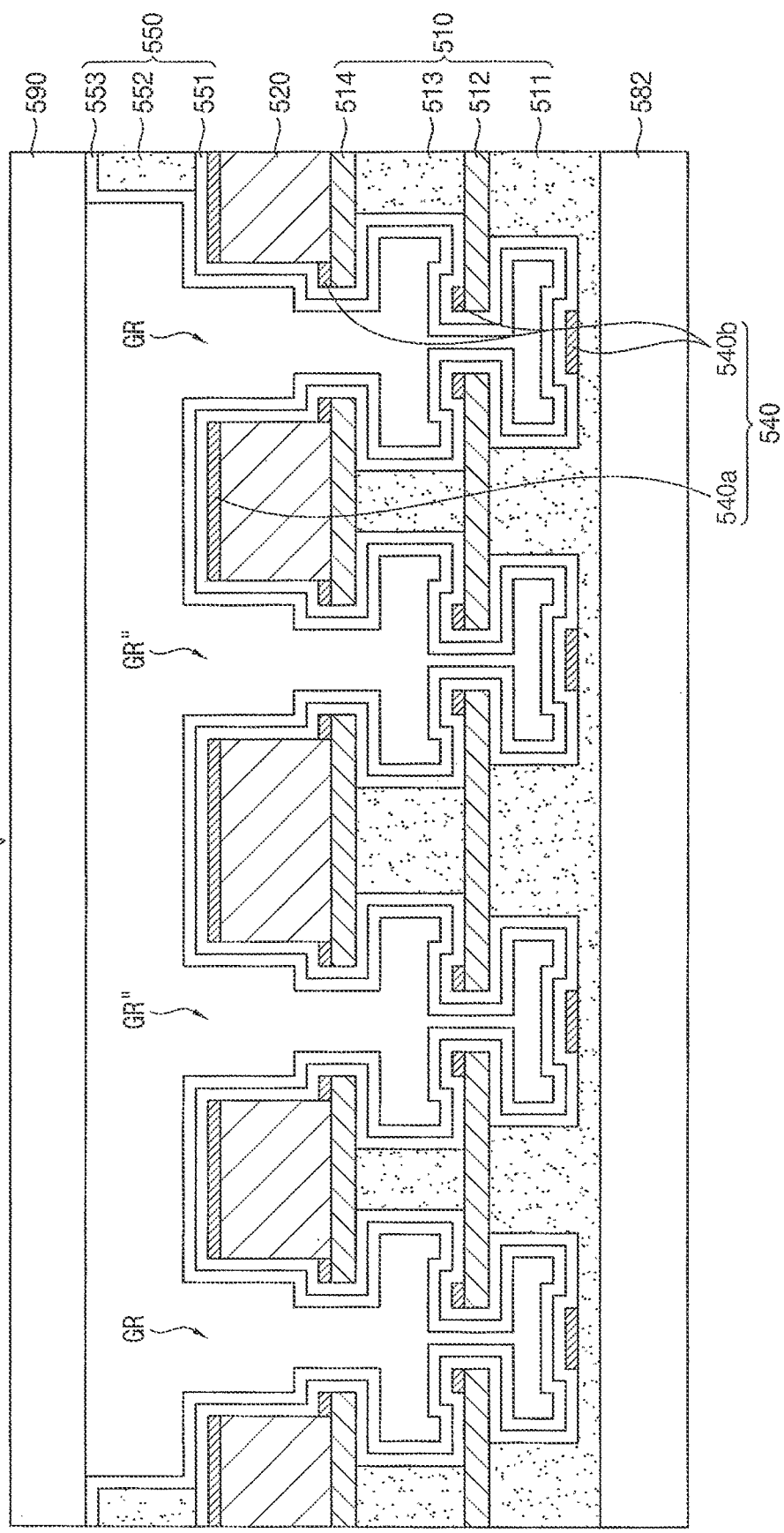
Figure 12F:
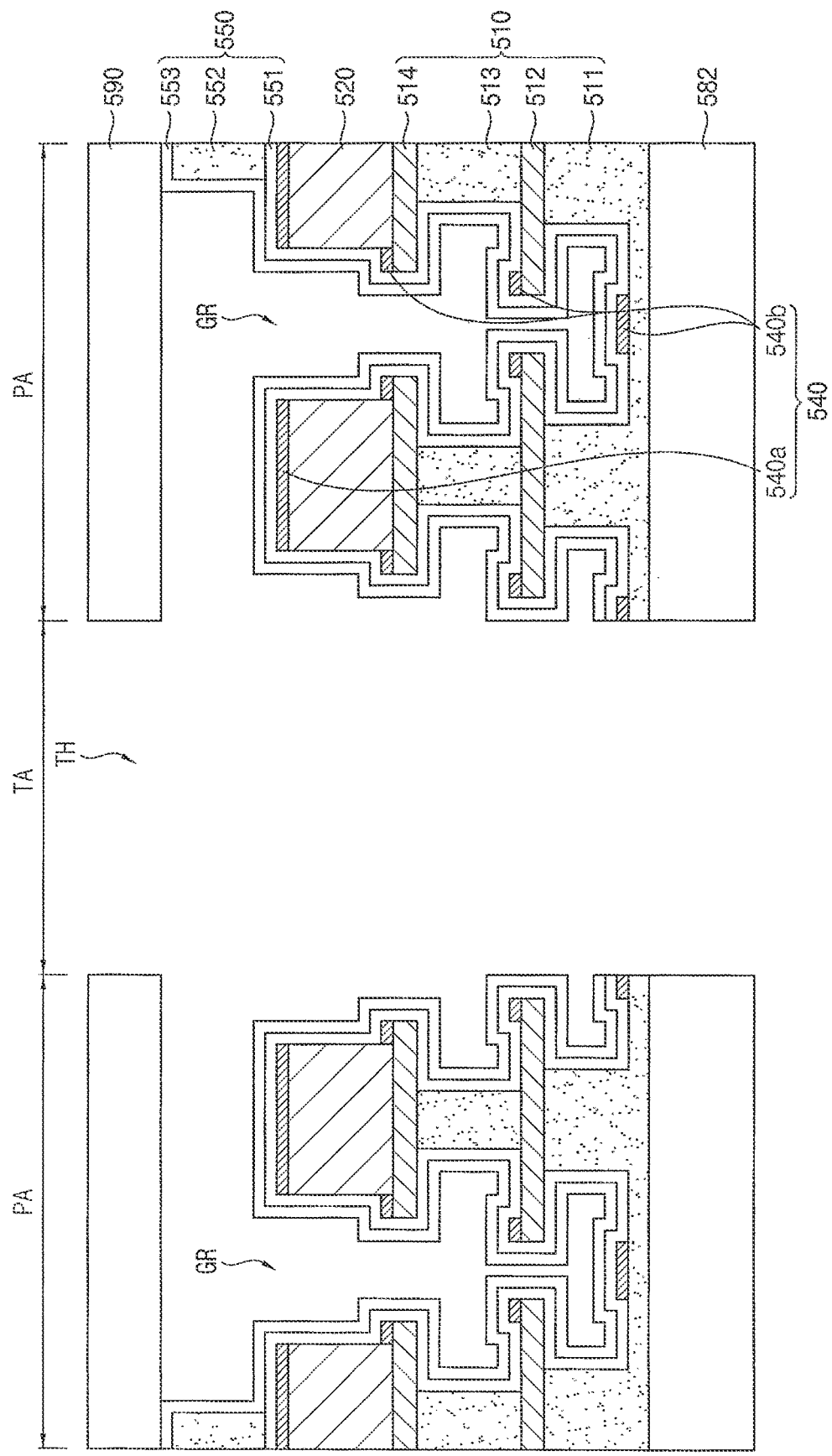

Referring to FIG. 12E, the polarizing member 590 may be formed on the encapsulation member 550. Referring to FIG. 12F, the through hole TH may be formed in the organic light emitting display device 500.

The through hole TH may be formed by using a third etching source ES3 illustrated in FIG. 12E. The third etching source ES3 may be various, and may include laser irradiation.

The through hole TH may pass through the lower protective film 582, the flexible substrate 510, the common layer 540, the encapsulation member 550, and the polarizing member 590. Thus, the through hole TH may correspond to an entirety of a thickness of the organic light emitting display device 500.

At least a portion of the temporary groove GR" may be exposed by the through hole TH. Therefore, the temporary groove GR" may provide a basis for forming the through hole TH. For example, the organic light emitting display device 500 may be cut along the temporary groove GR" so as to form the through hole TH. Since the through hole TH is formed based on the temporary groove GR", at least a portion of the peripheral area PA which is exposed by the through hole TH may be covered by the encapsulation member 550. Accordingly, the encapsulation member 550 may substantially block or decrease an inflow of moisture and/or oxygen into an edge of the peripheral area PA which is exposed by the through hole TH.

The organic light emitting display devices according to embodiments of the present disclosure may be applied to a display device included in a computer, a notebook, a mobile phone, a smartphone, a smart pad, a PMP, a PDA, an MP3 player, or the like.

By way of summation and review, to improve performance and lifespan of the organic light emitting display device and to minimize influence of moisture and/or oxygen from outside, the organic light emitting display device may be hermetically sealed. In a general organic light emitting display device, an organic light emitting element included in the organic light emitting display device may interact with moisture and/or oxygen flowed in from outside, and the organic light emitting element may be degraded.

As described above, embodiments may provide an organic light emitting display device in which moisture transmission is blocked. Embodiments may also provide a method of manufacturing an organic light emitting display device for blocking moisture transmission. An organic light emitting display device according an embodiment may include the flexible substrate on which an undercut groove is formed, and the common layer may be disconnected by the groove, so that moisture transmission may be blocked. A method of manufacturing the organic light emitting display device according to an embodiment may include forming the undercut groove on the flexible substrate by irradiating laser, so that moisture transmission may be blocked.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   a flexible substrate having a groove, the groove being undercut;
   a common layer on the flexible substrate, the common layer comprising an organic light emitting layer and being disconnected by the groove; and
   an encapsulation member on the common layer, the encapsulation member covering the common layer,
   wherein the flexible substrate comprises a first plastic layer and a first barrier layer on the first plastic layer,
   wherein the first plastic layer is undercut at the groove with respect to the first barrier layer,
   wherein the first plastic layer is formed of a plastic material, wherein the first barrier layer is formed of an inorganic material;

wherein the organic light emitting layer is on the flexible substrate and spaced from the groove; and wherein the flexible substrate comprises a second plastic layer on the first barrier layer and a second barrier layer on the second plastic layer, and wherein the second plastic layer is undercut at the groove with respect to the second barrier layer.

2. The organic light emitting display device as claimed in claim 1, wherein a laser absorption rate of the first plastic layer is greater than a laser absorption rate of the first barrier layer.

3. The organic light emitting display device as claimed in claim 1, wherein the groove corresponds to an entire thickness of the first barrier layer and a portion of the entire thickness of the first plastic layer.

4. The organic light emitting display device as claimed in claim 1, wherein a laser absorption rate of the second plastic layer is greater than a laser absorption rate of the second barrier layer.

5. The organic light emitting display device as claimed in claim 1, wherein a width of the groove at the second barrier layer is greater than a width of the groove at the first barrier layer.

6. The organic light emitting display device as claimed in claim 1, wherein each of the first plastic layer and the second plastic layer comprises at least one of polyimide (PI), polyethylene naphthalate (PEN), polyethylene terephthalate (PET), polyarylate, polycarbonate (PC), polyetherimide (PEI), or polyether sulfone (PES).

7. The organic light emitting display device as claimed in claim 1, wherein each of the first barrier layer and the second barrier layer comprises at least one of silicon oxide, silicon nitride, or amorphous silicon.

8. The organic light emitting display device as claimed in claim 1, wherein the common layer comprises a first portion outside the groove and a second portion inside the groove, and wherein the first portion and the second portion are disconnected from each other.

9. The organic light emitting display device as claimed in claim 8, wherein the encapsulation member covers the first portion of the common layer, the second portion of the common layer, and a surface of the flexible substrate that is exposed by the groove.

10. The organic light emitting display device as claimed in claim 1, wherein the encapsulation member comprises at least one inorganic layer and at least one organic layer.

11. The organic light emitting display device as claimed in claim 10, wherein the at least one inorganic layer covers a surface of the flexible substrate that is exposed by the groove.

12. The organic light emitting display device as claimed in claim 10, wherein the at least one organic layer is outside the groove.

13. The organic light emitting display device as claimed in claim 1, wherein the encapsulation member comprises a first inorganic layer on the common layer, a second inorganic layer on the first inorganic layer, and an organic layer between the first inorganic layer and the second inorganic layer.

14. An organic light emitting display device, comprising:
a flexible substrate having a display area, a through area, and a peripheral area, and having a groove in the peripheral area, the groove being undercut;
an organic light emitting element on the display area of the flexible substrate;
a common layer on the peripheral area of the flexible substrate, the common layer being disconnected by the groove; and
an encapsulation member on the organic light emitting element and the common layer,
wherein the flexible substrate comprises a first plastic layer and a first barrier layer on the first plastic layer,
wherein the first plastic layer is undercut at the groove with respect to the first barrier layer,
wherein the first plastic layer is formed of a plastic material,
wherein the first barrier layer is formed of an inorganic material;
wherein the organic light emitting display device defines a through hole at the through area, the through hole extending through an entire thickness of the organic light emitting display device in a thickness direction of the organic light emitting display device;
wherein the through hole is adjacent to the groove and spaced from the display area by the groove; and
wherein the organic light emitting element comprises:
a pixel electrode;
a first organic function layer on the pixel electrode;
an organic light emitting layer on the first organic function layer;
a second organic function layer on the organic light emitting layer; and
a common electrode on the second organic function layer.

15. The organic light emitting display device as claimed in claim 14, wherein the peripheral area is between the display area and the through area.

16. The organic light emitting display device as claimed in claim 15, wherein the peripheral area surrounds the through area, and
wherein the display area surrounds the peripheral area.

17. The organic light emitting display device as claimed in claim 7, wherein the common layer is an extended portion of at least one of the first organic function layer, the second organic function layer, or the common electrode.

18. The organic light emitting display device as claimed in claim 14, further comprising a capping layer between the organic light emitting element and the encapsulation member,
wherein the common layer is an extended portion of at least two of the first organic function layer, the second organic function layer, the common layer, or the capping layer.

19. The organic light emitting display device as claimed in claim 14, wherein the through area is spaced from the display area by the peripheral area.

20. The organic light emitting display device as claimed in claim 1, wherein the flexible substrate has a display area and a peripheral area separate from the display area, and wherein the organic light emitting layer is within the display area and the groove is within the peripheral area.

* * * * *